(12) United States Patent
Cho et al.

(10) Patent No.: US 11,342,330 B2
(45) Date of Patent: May 24, 2022

(54) SEMICONDUCTOR MEMORY DEVICE

(71) Applicant: Samsung Electronics Co., Ltd., Suwon-si (KR)

(72) Inventors: Min Hee Cho, Suwon-si (KR); Hyunmog Park, Seoul (KR); Woo Bin Song, Hwaseong-si (KR); Minsu Lee, Seongnam-si (KR); Wonsok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/172,124

(22) Filed: Feb. 10, 2021

(65) Prior Publication Data

US 2022/0013525 A1 Jan. 13, 2022

(30) Foreign Application Priority Data

Jul. 10, 2020 (KR) .................. 10-2020-0085543

(51) Int. Cl.
*H01L 27/108* (2006.01)

(52) U.S. Cl.
CPC .............................. *H01L 27/10805* (2013.01)

(58) Field of Classification Search
CPC . H01L 27/108; H01L 28/90; H01L 29/42376; H01L 29/7827; H01L 23/528; H01L 27/0688; H01L 29/0847; H01L 29/1037; H01L 27/10835; H01L 27/10852; H01L 27/10873; G11C 11/403
See application file for complete search history.

(56) References Cited

U.S. PATENT DOCUMENTS

| | | | |
|---|---|---|---|
| 8,274,112 B2 | 9/2012 | Kim et al. | |
| 9,698,272 B1 | 7/2017 | Ikeda et al. | |
| 9,761,580 B1 | 9/2017 | Ramaswamy | |
| 9,842,839 B1 | 12/2017 | Sills et al. | |
| 9,859,443 B2 | 1/2018 | Yamazaki et al. | |
| 10,157,926 B2 | 12/2018 | Fang et al. | |
| 10,192,873 B2 | 1/2019 | Sills et al. | |
| 10,347,637 B2 | 7/2019 | Sandhu | |
| 10,355,002 B2 | 7/2019 | Sills | |
| 2012/0134195 A1 | 5/2012 | Sim | |
| 2018/0061835 A1* | 3/2018 | Yang | H01L 29/42376 |
| 2019/0067453 A1 | 2/2019 | Torek | |
| 2020/0058798 A1 | 2/2020 | Pillarisetty et al. | |

* cited by examiner

*Primary Examiner* — Mohammed R Alam
(74) *Attorney, Agent, or Firm* — Muir Patent Law, PLLC

(57) ABSTRACT

A semiconductor memory device is provided. The device may include a lower gate line provided on a substrate and extended in a first direction, an upper gate line vertically overlapped with the lower gate line and extended in the first direction, a first capacitor provided between the lower gate line and the upper gate line, a second capacitor provided between the lower gate line and the upper gate line and spaced apart from the first capacitor in the first direction, a lower semiconductor pattern provided to penetrate the lower gate line and connected to the first capacitor, an upper semiconductor pattern provided to penetrate the upper gate line and connected to the second capacitor, and a lower insulating pattern provided between the second capacitor and the lower gate line to cover the entire region of a bottom surface of the second capacitor.

20 Claims, 33 Drawing Sheets

FIG. 6A
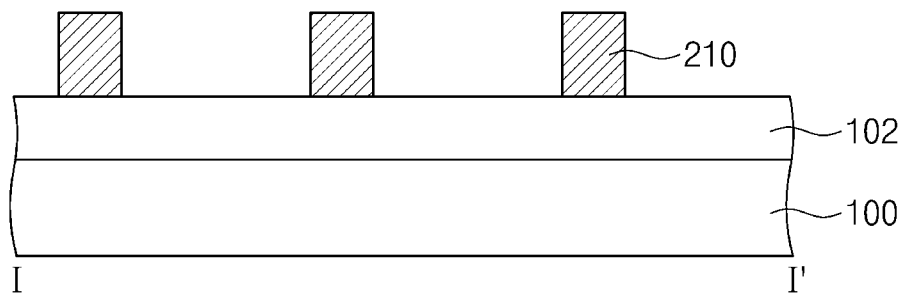
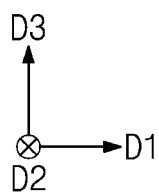
FIG. 6B
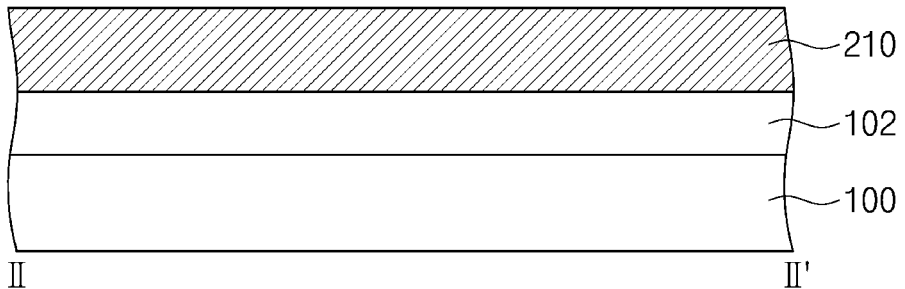
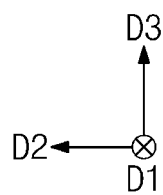

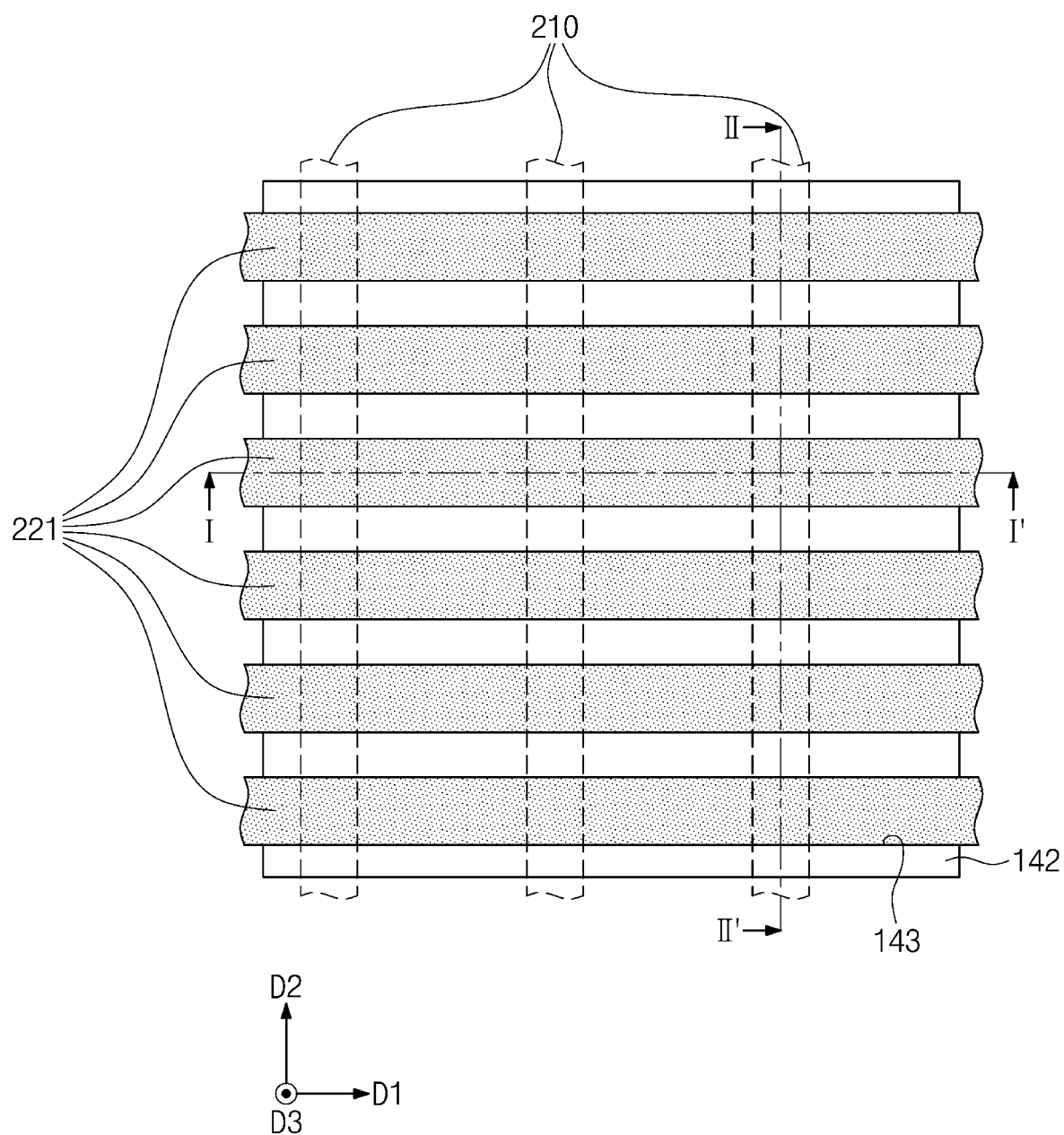

FIG. 8A
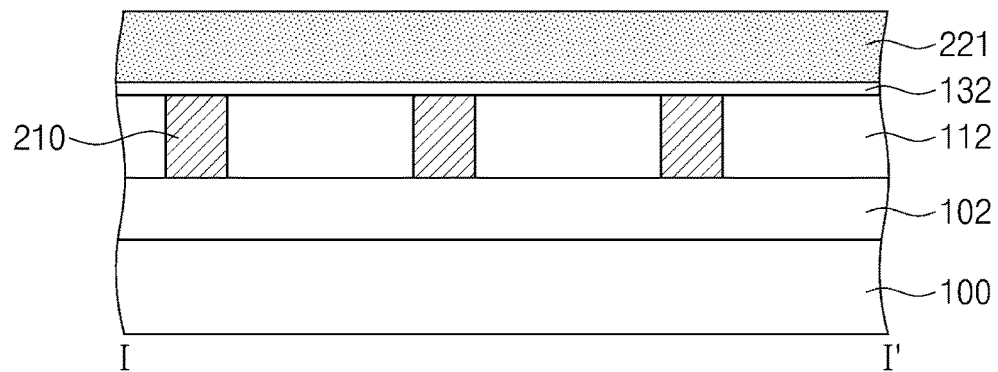
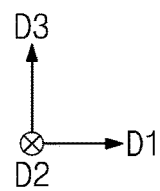
FIG. 8B
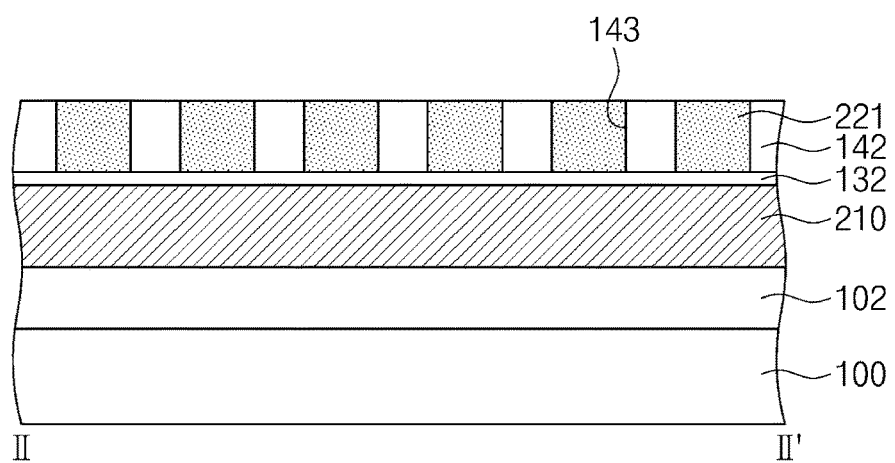
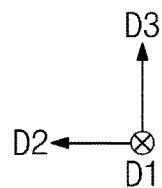

FIG. 10A
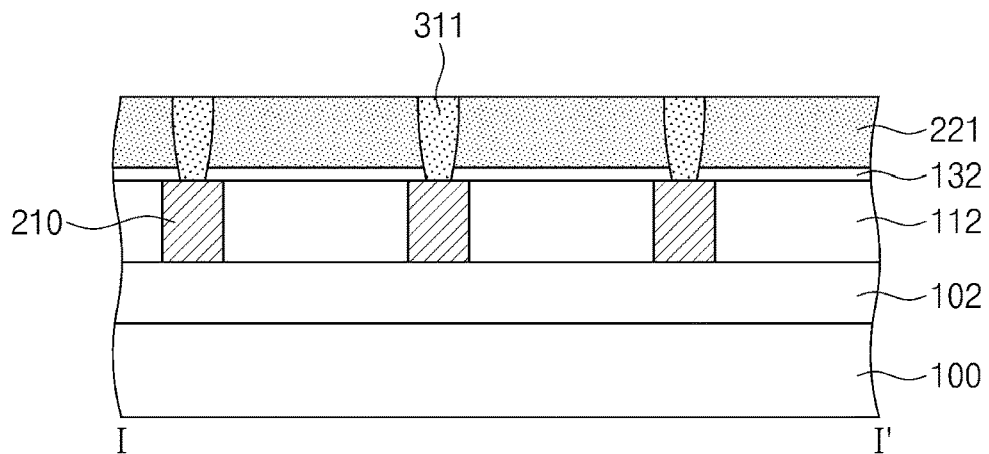
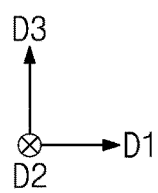
FIG. 10B
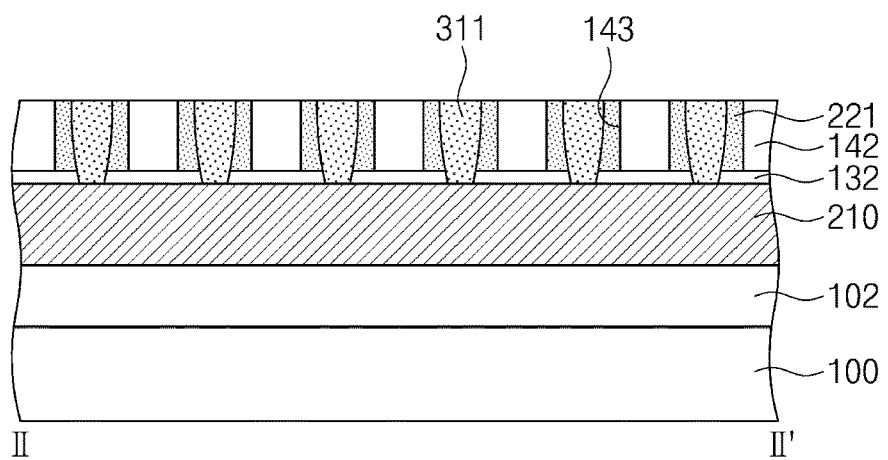
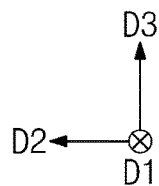

FIG. 12A
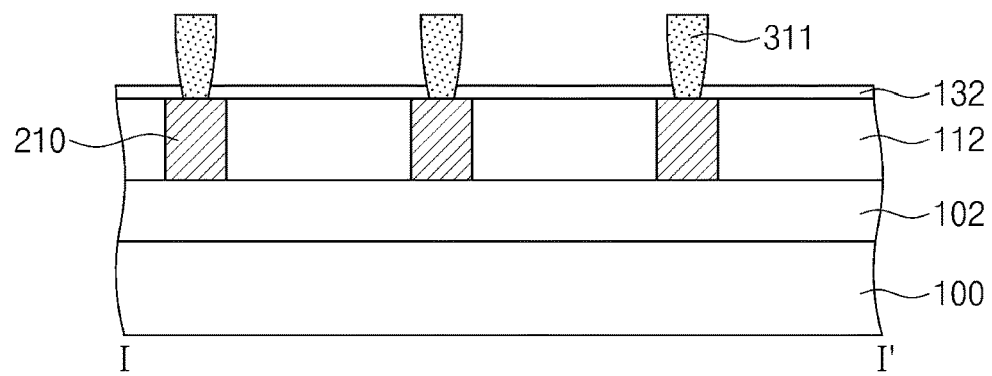
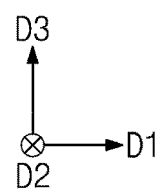
FIG. 12B
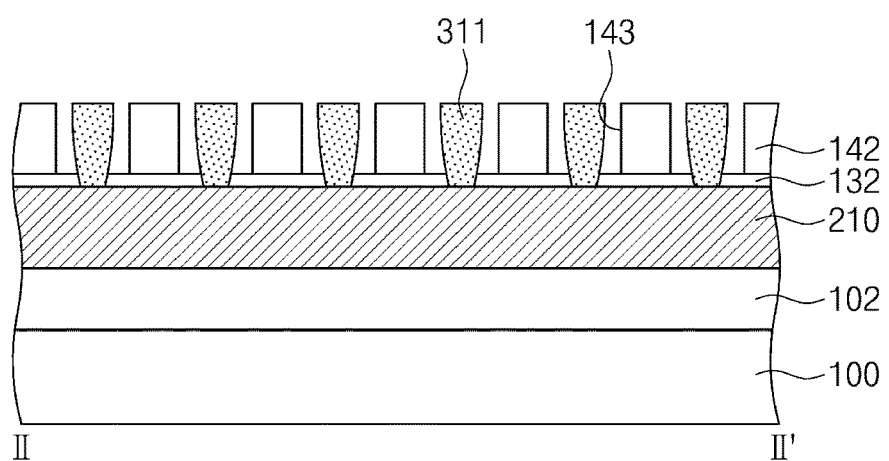
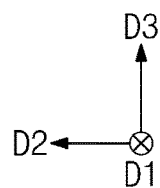

FIG. 14A
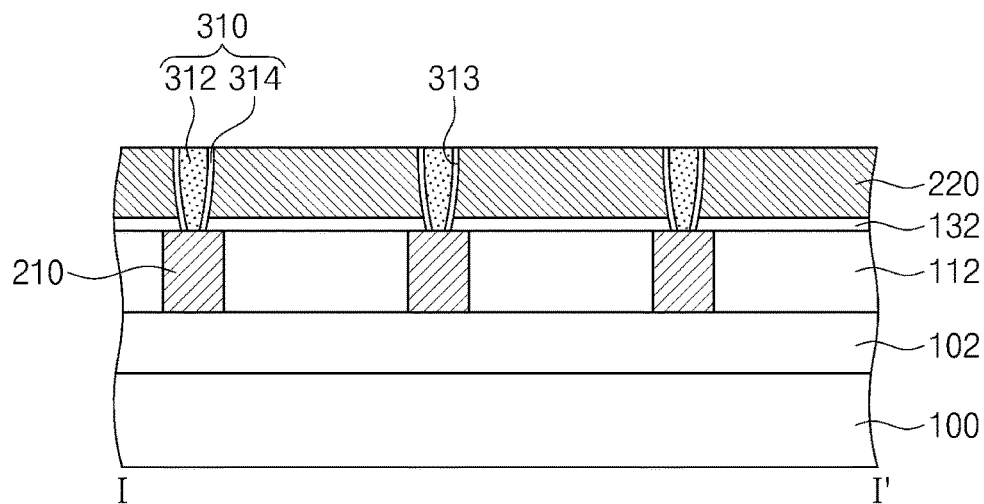
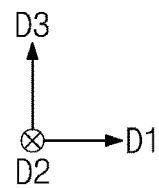
FIG. 14B
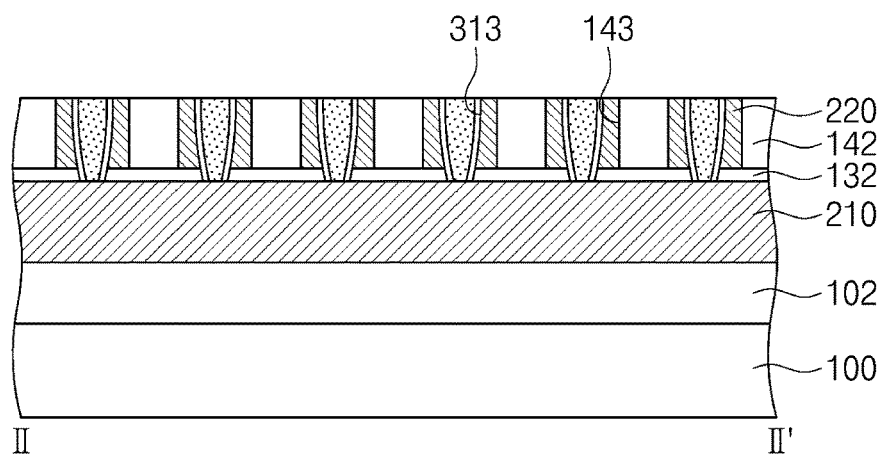
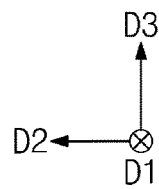

FIG. 16A
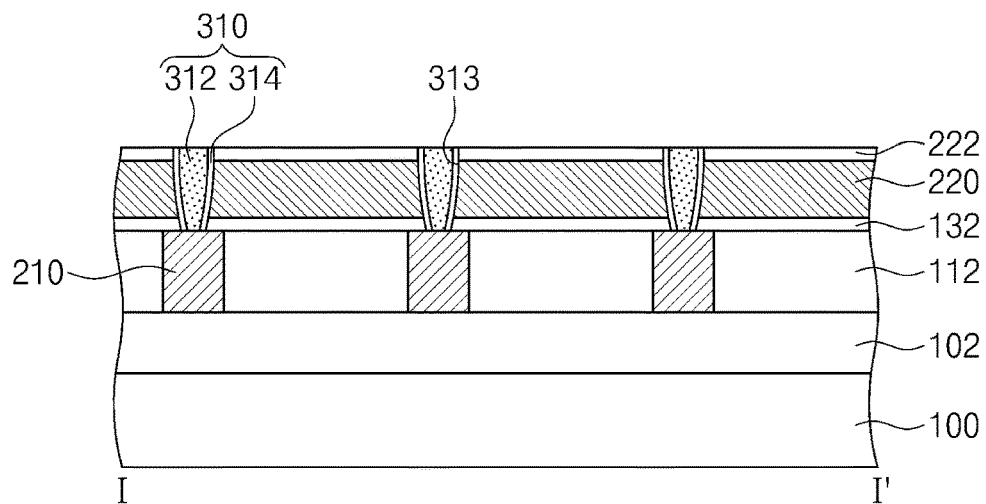
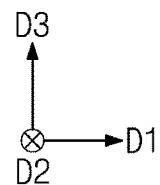
FIG. 16B
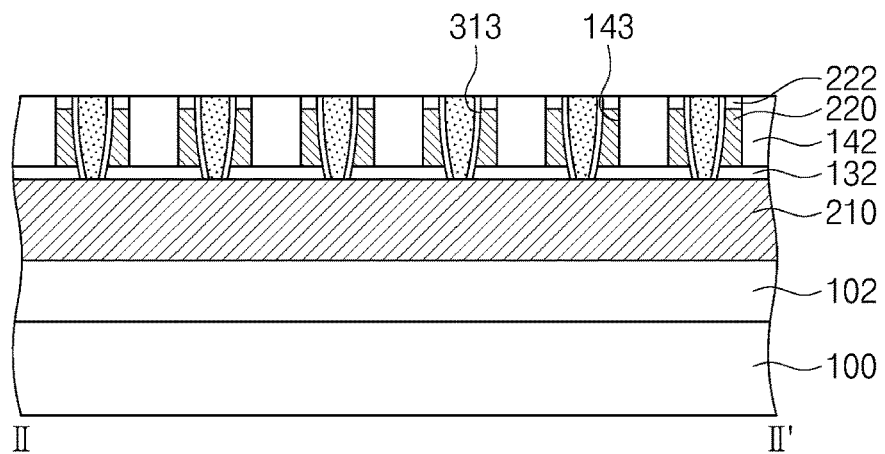
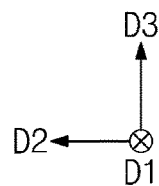

FIG. 18A
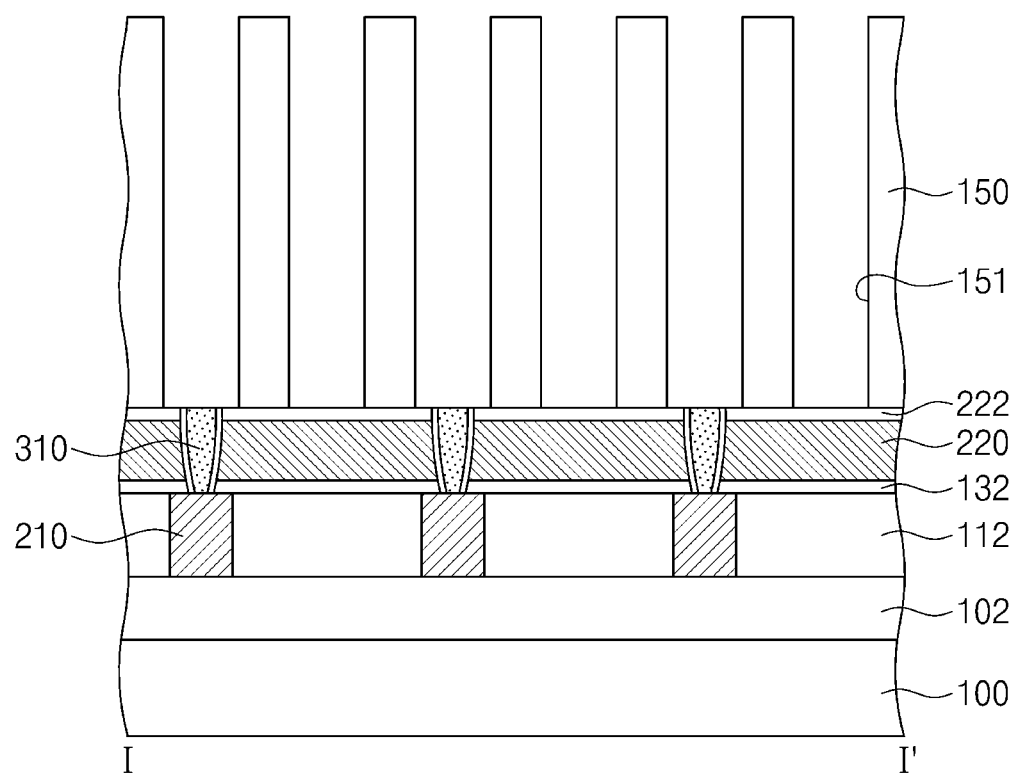
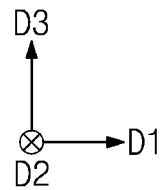

FIG. 22A
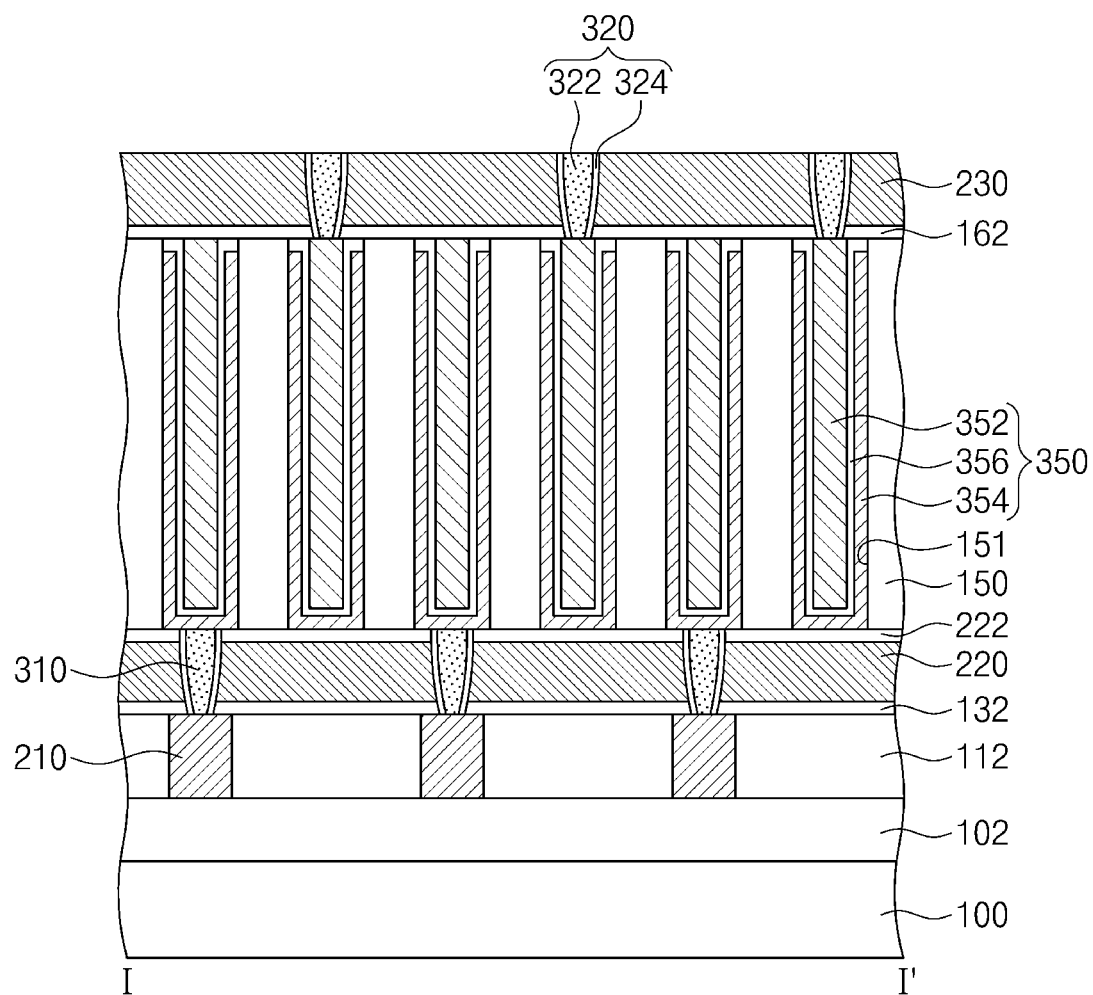
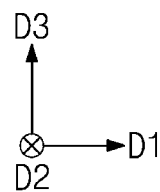

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2020-0085543, filed on Jul. 10, 2020, in the Korean Intellectual Property Office, the entire contents of which are hereby incorporated by reference.

BACKGROUND OF THE INVENTION

The present disclosure relates to a semiconductor memory device, and in particular, to and a semiconductor memory device with improved electric characteristics and higher reliability.

In order to meet an increasing demand for highly-integrated semiconductor devices, metal-oxide-semiconductor field effect transistors are being aggressively scaled down. However, a reduction in a minimum feature size or critical dimension (CD) of the semiconductor device causes an increase in resistance of interconnection lines and electrostatic capacitance therebetween and thereby a difficulty in realizing a high speed operation of the semiconductor device. Accordingly, a variety of studies are being conducted to overcome technical limitations associated with the scale-down of the semiconductor memory device and to realize semiconductor memory devices with high performance properties.

SUMMARY

An embodiment of the inventive concept provides a semiconductor memory device with improved electric characteristics and higher reliability.

According to an embodiment of the inventive concept, a semiconductor memory device may include a lower gate line provided on a substrate and extended lengthwise in a first direction, an upper gate line vertically overlapped with the lower gate line and extended lengthwise in the first direction, a first capacitor provided between the lower gate line and the upper gate line, a second capacitor provided between the lower gate line and the upper gate line and spaced apart from the first capacitor in the first direction, a lower semiconductor pattern provided to penetrate the lower gate line and connected to the first capacitor, an upper semiconductor pattern provided to penetrate the upper gate line and connected to the second capacitor, and a lower insulating pattern provided between the second capacitor and the lower gate line to cover the entire region of a bottom surface of the second capacitor.

According to an embodiment of the inventive concept, a semiconductor memory device may include a lower gate line provided on a substrate and extended lengthwise in a first direction, lower conductive lines provided between the substrate and the lower gate line and extended lengthwise in a second direction perpendicular to the first direction, an upper gate line vertically overlapped with the lower gate line and extended lengthwise in the first direction, upper conductive lines provided on the upper gate line and extended lengthwise in the second direction, a first capacitor provided between the lower gate line and the upper gate line, a second capacitor provided between the lower gate line and the upper gate line and spaced apart from the first capacitor in the first direction, lower insulating patterns provided between the first capacitor and the lower gate line and between the second capacitor and the lower gate line, an upper insulating layer provided between the first capacitor and the upper gate line and between the second capacitor and the upper gate line, a lower semiconductor pattern provided to penetrate the lower gate line and the lower insulating pattern and to connect the first capacitor to one of the lower conductive lines, and an upper semiconductor pattern provided to penetrate the upper gate line and the upper insulating layer and to connect the second capacitor to one of the upper conductive lines. A distance between two adjacent ones of the lower conductive lines may be larger than a distance between the first capacitor and the second capacitor.

According to an embodiment of the inventive concept, a semiconductor memory device may include a lower gate line provided on a substrate and extended lengthwise in a first direction, an upper gate line vertically overlapped with the lower gate line and extended lengthwise in the first direction, a capacitor between the lower gate line and the upper gate line, the capacitor including a first electrode and a second electrode on the first electrode, an upper conductive line provided on the upper gate line and extended lengthwise in a second direction perpendicular to the first direction, an upper semiconductor pattern provided to penetrate the upper gate line and to connect the upper conductive line to the second electrode, and a lower insulating pattern provided between a top surface of the lower gate line and a bottom surface of the first electrode.

According to an embodiment of the inventive concept, a semiconductor memory device may include a lower gate line provided on a substrate and extended lengthwise in a first direction, lower conductive lines provided between the substrate and the lower gate line and extended lengthwise in a second direction perpendicular to the first direction, an upper gate line vertically overlapped with the lower gate line and extended lengthwise in the first direction, capacitors provided between the lower gate line and the upper gate line and spaced apart from each other in the first direction, an oxide semiconductor pattern including a first portion between the substrate and the lower conductive lines and a second portion between the lower conductive lines, and lower insulating patterns between the oxide semiconductor pattern and the lower conductive lines.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 5, 7, 9, 11, 13, 15, 17, 19, and 21 are plan views illustrating a method of fabricating a semiconductor memory device, according to an example embodiment of the inventive concept.

FIGS. 6A, 8A, 10A, 12A, 14A, 16A, 18A, 20A, and 22A are sectional views taken along lines I-I' of FIGS. 5, 7, 9, 11, 13, 15, 17, 19 and 21, respectively.

FIGS. 6B, 8B, 10B, 12B, 14B, 16B, 18B, 20B, and 22B are sectional views taken along lines II-IP of FIGS. 5, 7, 9, 11, 13, 15, 17, 19 and 21, respectively.

DETAILED DESCRIPTION

Figure 1:
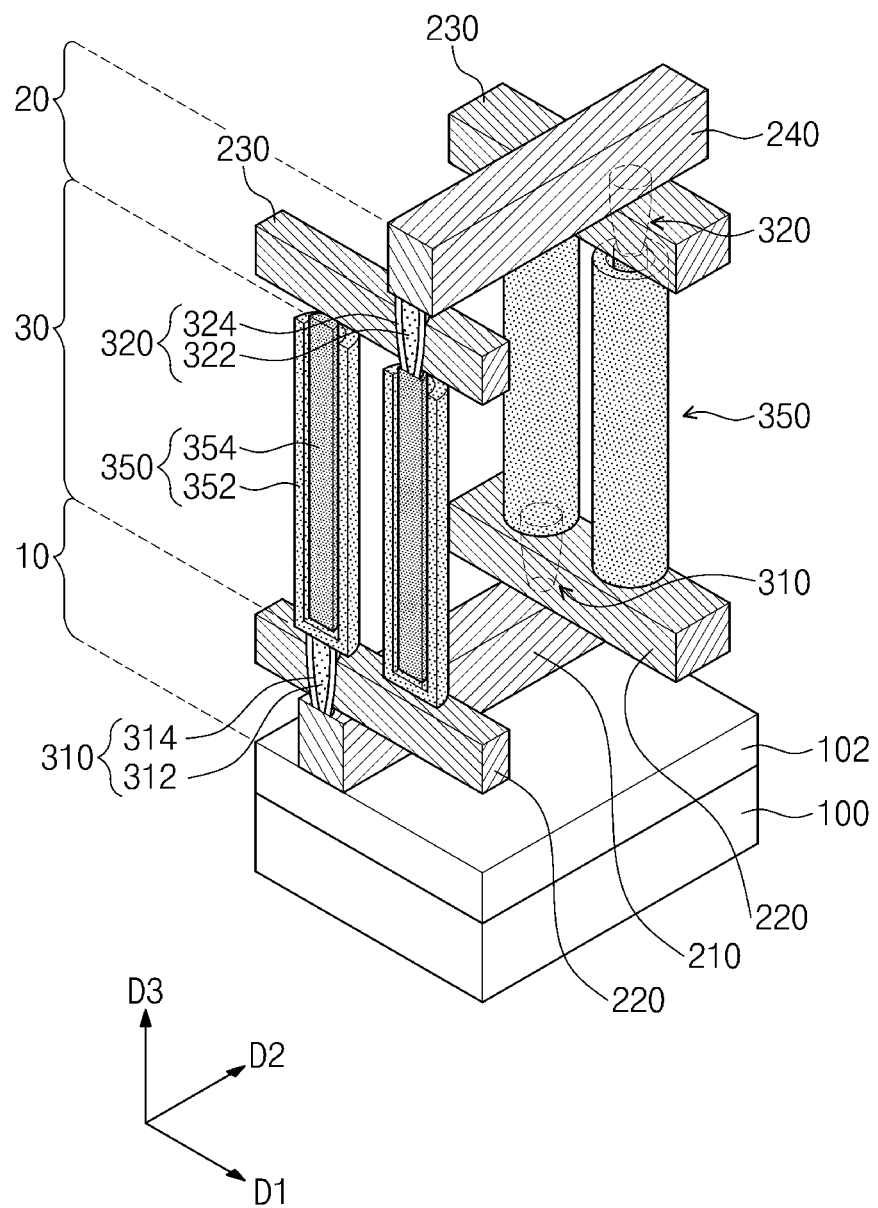
FIG. 1 is a perspective view schematically illustrating a portion of a semiconductor memory device, according to an example embodiment of the inventive concept.

Example embodiments of the inventive concepts will now be described more fully with reference to the accompanying drawings, in which example embodiments are shown. In the drawings, like numbers refer to like elements throughout.

FIG. 1 is a perspective view schematically illustrating a portion of a semiconductor memory device, according to an example embodiment of the inventive concept.

Referring to FIG. 1, a semiconductor memory device according to an example embodiment of the inventive concept may include a lower selection region 10, an upper selection region 20, and a data storage region 30 between the lower selection region 10 and the upper selection region 20.

The data storage region 30 may include a plurality of capacitors 350. The capacitors 350 may be arranged in first and second directions D1 and D2 that are parallel to a top surface of a substrate 100. Each of the capacitors 350 may constitute a unit memory cell, in conjunction with the lower or upper selection region 10 or 20. If electric charges are provided from the lower or upper selection region 10 or 20, each of the capacitors 350 may store data of 1 or more bits. In order to store the electric charges, each of the capacitors 350 may include a first electrode 354 and a second electrode 352, which are disposed adjacent to each other.

The lower selection region 10 may be disposed below the data storage region 30. The lower selection region 10 may include a lower conductive line 210, lower gate lines 220, and a lower channel structure 310. Each of the lower conductive line 210 and the lower gate lines 220 may be a bar- or pillar-shaped pattern extending in a specific direction. The lower gate lines 220 may be extended lengthwise in the first direction D1, which is parallel to the top surface of the substrate 100. The lower conductive line 210 may be extended lengthwise in the second direction D2, which is parallel to the top surface of the substrate 100, between the lower gate lines 220 and the substrate 100. The second direction D2 may be perpendicular to the first direction D1. The lower gate lines 220 and the lower conductive line 210 may be spaced apart from each other in a third direction D3 that is perpendicular to the top surface of the substrate 100. When viewed in a plan view, each of the lower gate lines 220 may be provided to cross the lower conductive line 210. An item, layer, or portion of an item or layer described as extending "lengthwise" in a particular direction has a length in the particular direction and a width perpendicular to that direction, where the length is greater than the width.

The lower channel structures 310 may be disposed between the lower conductive line 210 and the capacitors 350. Each of the lower channel structure 310 may be provided to penetrate the lower gate line 220 and to connect a corresponding one of the capacitors 350 to the lower conductive line 210. For example, portions of the sidewalls of the lower channel structures 310 may be surrounded by the lower gate line 220. The lower channel structures 310 on the lower conductive line 210 may be spaced apart from each other in the second direction D2. For example, the lower selection region 10 may be connected to some of the capacitors 350, which are arranged in the second direction D2, through the lower channel structure 310. The others of the capacitors 350, which are spaced apart from the some of the capacitors 350 in the first direction D1, may not be connected to the lower selection region 10.

In detail, the lower channel structure 310 may include a lower semiconductor pattern 312 and a lower gate insulating pattern 314. The lower semiconductor pattern 312 may be provided to penetrate the lower gate line 220 and to connect the lower conductive line 210 to the first electrode 354. Depending on a voltage applied to the lower gate line 220, a current flow path between the lower conductive line 210 and the first electrode 354 may be formed in the lower semiconductor pattern 312. The lower semiconductor pattern 312 may have a truncated-cone or cylinder shape having a downwardly decreasing width. For example, a width of the lower semiconductor pattern 312 may decrease in a direction toward the lower conductive line 210. The lower semiconductor pattern 312 may be formed of or include at least one of doped semiconductor materials or oxide semiconductors. The lower gate insulating pattern 314 may be disposed between the lower semiconductor pattern 312 and the lower gate lines 220. The lower gate insulating pattern 314 may surround the lower semiconductor pattern 312. The lower gate insulating pattern 314 may serve as a gate insulating layer, which electrically disconnects the lower gate line 220 from the lower semiconductor pattern 312.

The upper selection region 20 may be disposed on the data storage region 30. The upper selection region 20 may be spaced apart from the lower selection region 10, with the data storage region 30 interposed therebetween, in the third direction D3. The upper selection region 20 may be connected to ones of the capacitors 350, which are not connected to the lower selection region 10. The upper selection region 20 may include an upper conductive line 240, upper gate lines 230, and an upper channel structure 320. Each of the upper conductive line 240 and the upper gate lines 230 may be a bar- or pillar-shaped pattern extending in a specific direction.

The upper gate lines 230 may be vertically overlapped with the lower gate lines 220 and may be extended in the first direction D1. The upper conductive line 240 may be provided on the upper gate lines 230 and may be extended in the second direction D2. The upper conductive line 240 may not be overlapped with the lower conductive line 210, when viewed in a plan view. The upper conductive line 240 may be spaced apart from the lower conductive line 210 in the first direction D1. The upper conductive line 240 and the upper gate lines 230 may be spaced apart from each other in the third direction D3.

The upper channel structures 320 may be disposed between the upper conductive line 240 and the capacitor 350. The upper channel structures 320 may be arranged in the second direction D2. When viewed in a plan view, the upper channel structures 320 may not be overlapped with the lower channel structures 310 and may be spaced apart from the lower channel structures 310 in the first direction D1. The upper channel structure 320 may include an upper semiconductor pattern 322 and an upper gate insulating pattern 324. The upper semiconductor pattern 322 may be provided to penetrate the upper gate line 230 and to connect the capacitor 350 to the upper conductive line 240. Depending on a voltage applied to the upper gate line 230, a current flow path between the upper conductive line 240 and the capacitor 350 may be formed in the upper semiconductor pattern 322.

The upper semiconductor pattern 322 may have a truncated-cone or cylinder shape having a downwardly decreasing width. For example, a width of the upper semiconductor pattern 322 may decrease in a direction of the capacitor 350. The upper semiconductor pattern 322 may be formed of or include at least one of doped semiconductor materials or oxide semiconductors. The upper gate insulating pattern 324 may be disposed between the upper semiconductor pattern 322 and the upper gate lines 230. The upper gate insulating pattern 324 may surround the upper semiconductor pattern 322. The upper gate insulating pattern 324 may serve as a gate insulating layer, which electrically disconnects the upper gate line 230 from the upper semiconductor pattern 322.

According to an example embodiment of the inventive concept, the unit memory cell of the semiconductor memory device may be composed of one transistor and one capacitor. The lower channel structure 310 and the lower gate line 220 may constitute a lower transistor. The upper channel structure 320 and the upper gate line 230 may constitute an upper transistor. Each of the capacitors 350 in the data storage region 30 may be selectively connected to one of the lower transistor and the upper transistor. The capacitor 350 connected to the lower transistor may not be connected to the upper transistor, and the capacitor 350 connected to the upper transistor may not be connected to the lower transistor.

Figure 2:
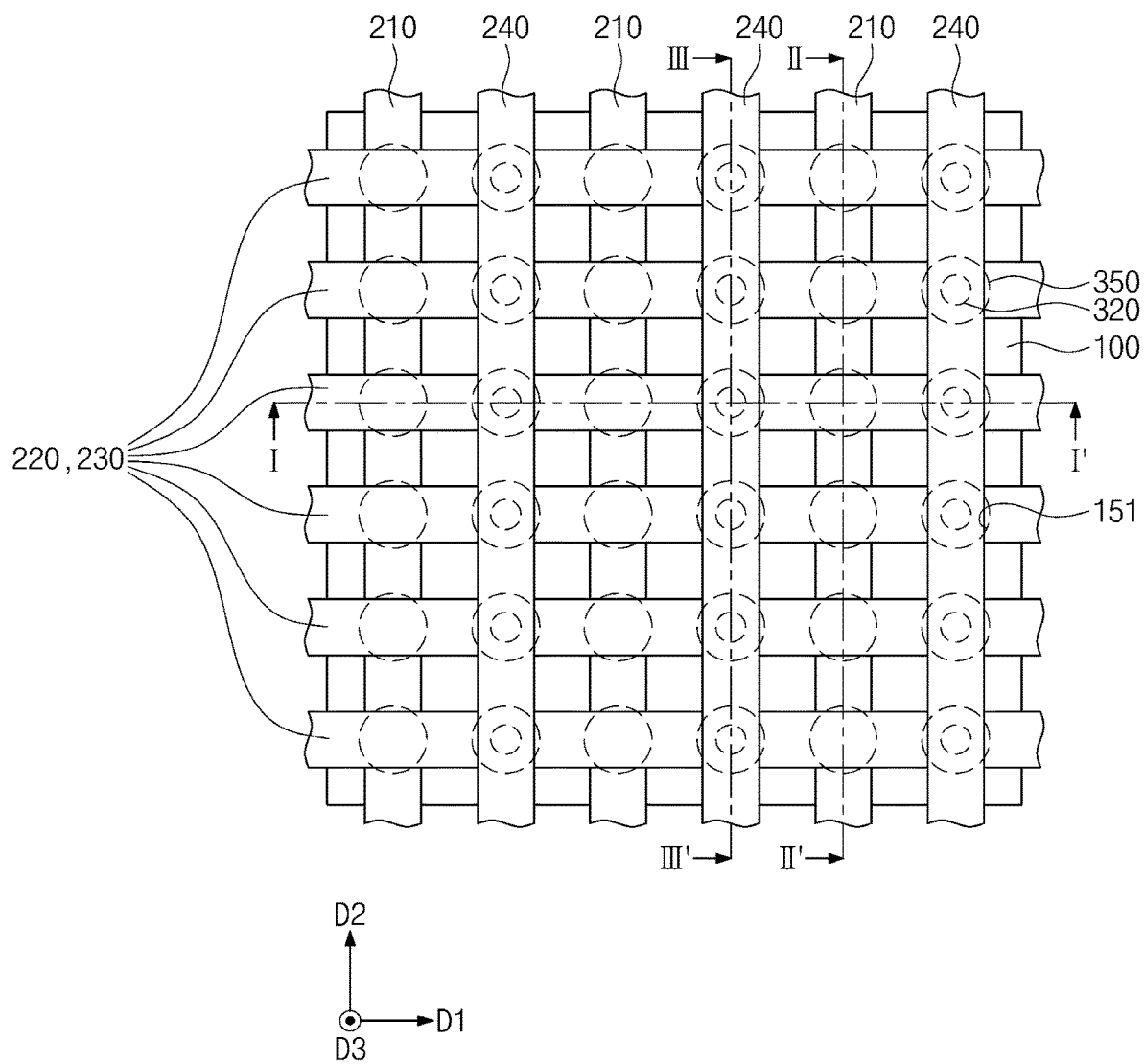
FIG. 2 is a plan view illustrating a semiconductor memory device, according to an example embodiment of the inventive concept.
Figure 3A:
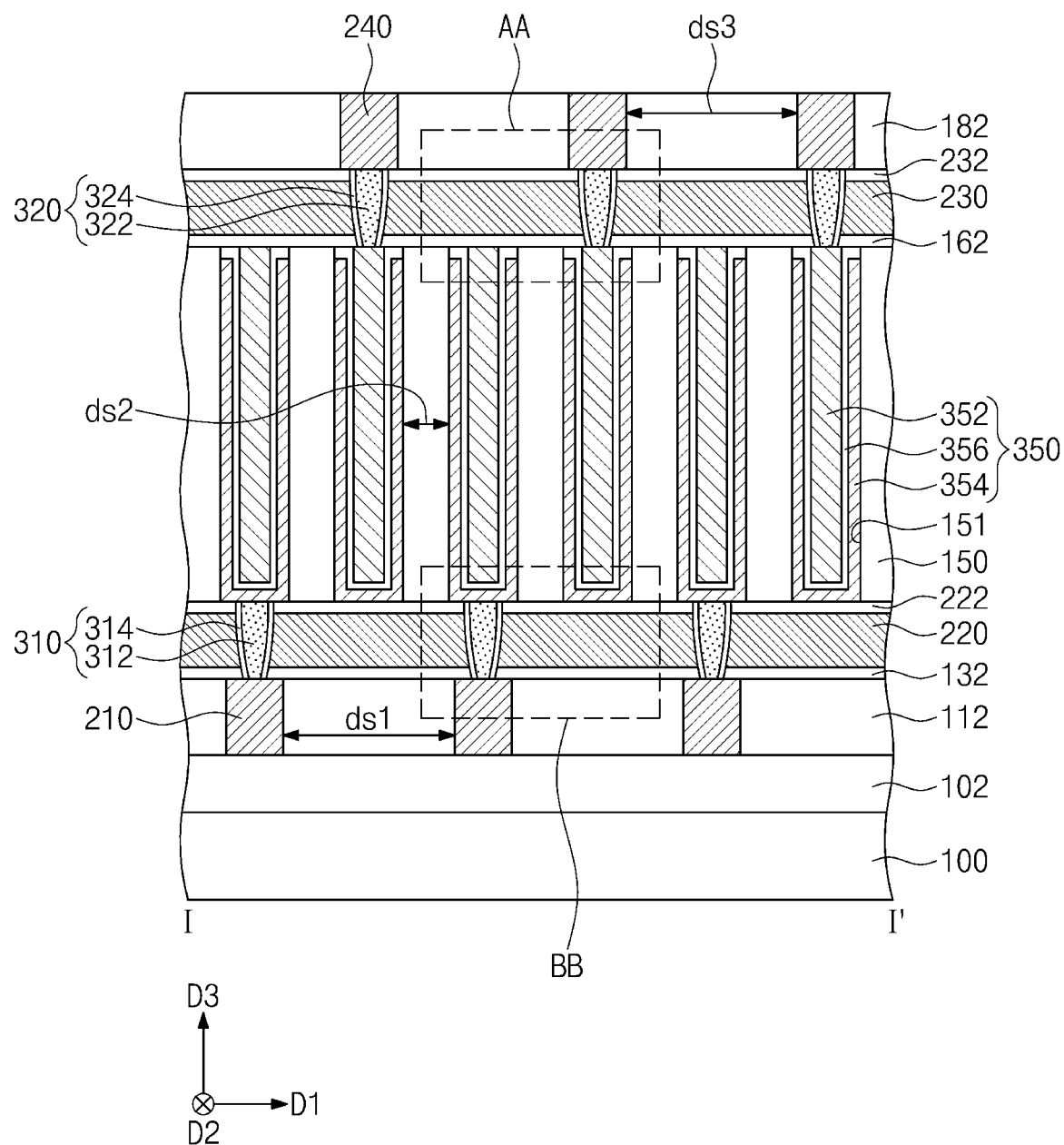
FIGS. 3A to 3C are sectional views respectively taken along lines I-I', and of FIG. 2.
Figure 3B:
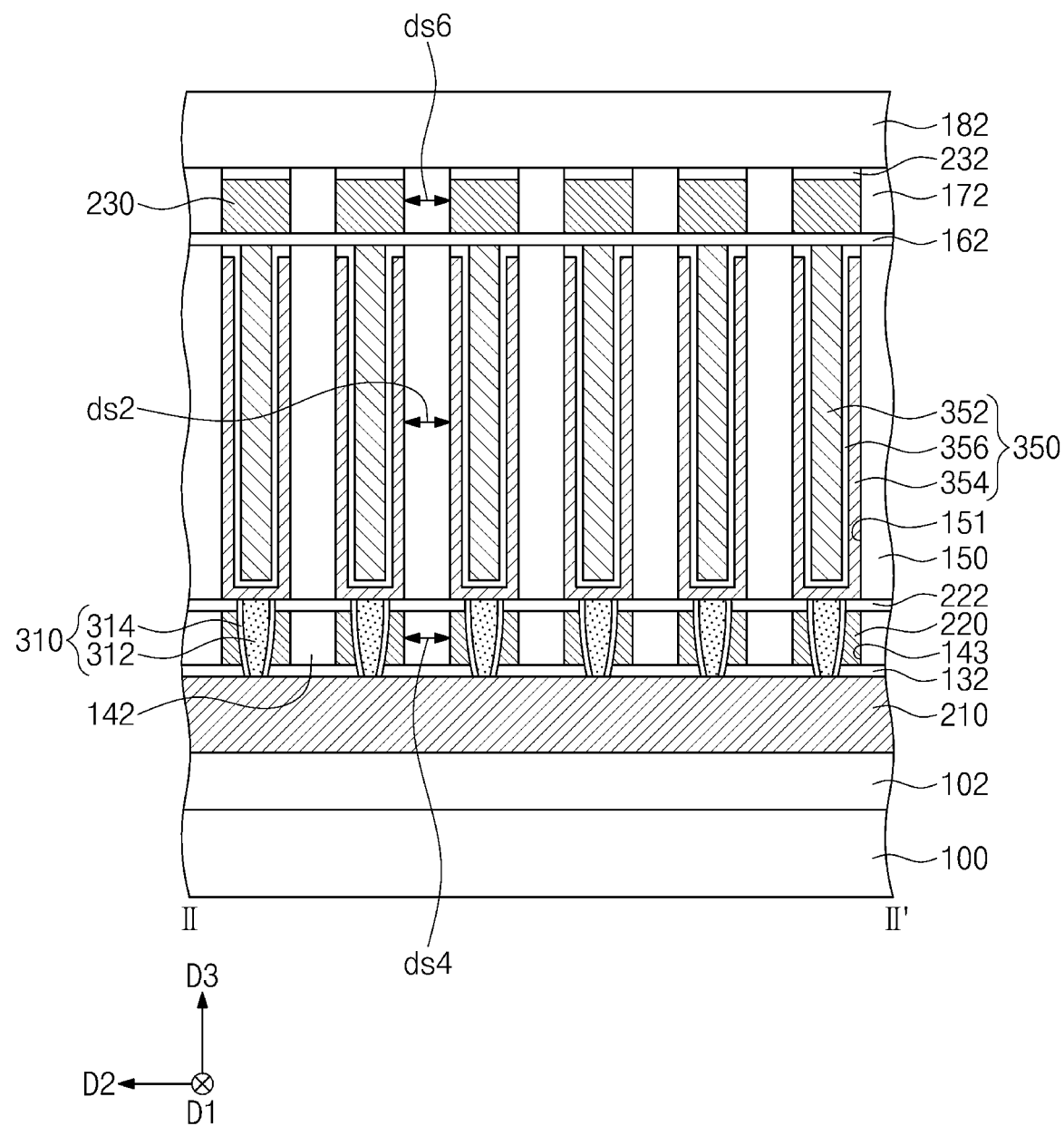
Figure 3C:
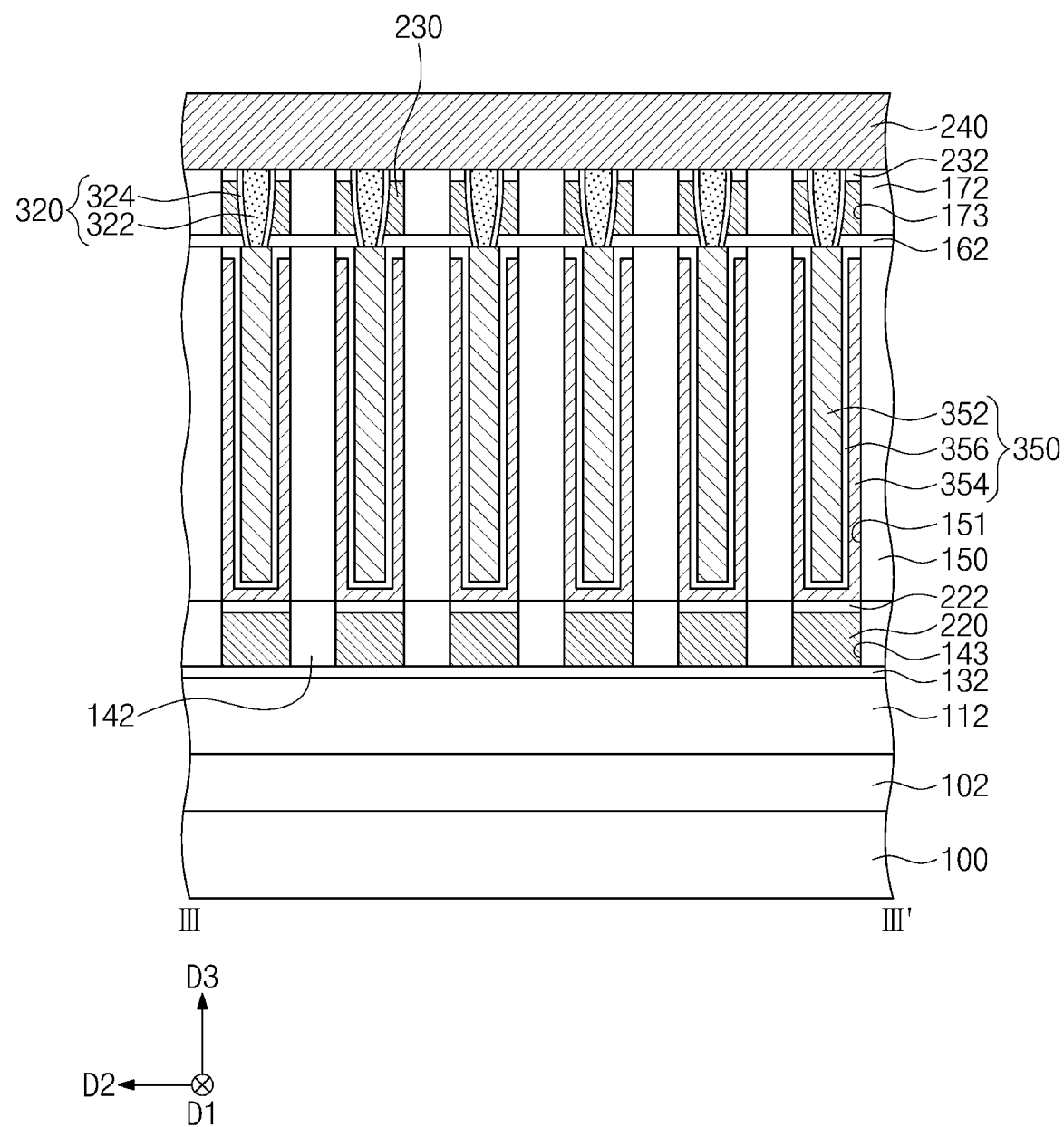

FIG. 2 is a plan view illustrating a semiconductor memory device according to an example embodiment of the inventive concept. FIGS. 3A, 3B, and 3C are sectional views respectively taken along lines I-I', and of FIG. 2. For concise description, elements previously described with reference to FIG. 1 may be identified by the same reference numbers without repeating an overlapping description thereof.

Referring to FIGS. 2 and 3A to 3C, a first lower insulating layer 102 and a second lower insulating layer 112 may be disposed on the substrate 100. A bottom surface of the first lower insulating layer 102 may contact the top surface of the substrate 100, and a bottom surface of the second lower insulating layer 112 may contact a top surface of the first lower insulating layer 102. The substrate 100 may include at least one of a silicon substrate, a germanium substrate, and/or a silicon-germanium substrate. The first lower insulating layer 102 and the second lower insulating layer 112 may include a silicon oxide layer, a silicon nitride layer, and/or a silicon oxynitride layer. The term "contact," as used herein, refers to a direction connection (i.e., touching) unless the context indicates otherwise.

The lower conductive lines 210 may be provided on the first lower insulating layer 102. A bottom surface of the lower conductive lines 210 may contact a top surface of the first lower insulating layer 102. The lower conductive lines 210 may be extended lengthwise in the second direction D2 and may be spaced apart from each other in the first direction D1. Side surfaces of the lower conductive lines 210 may be covered with the second lower insulating layer 112. For example, the second lower insulating layer 112 may contact the side surfaces of the lower conductive lines 210. Top surfaces of the lower conductive lines 210 may be located at the same vertical level as a top surface of the second lower insulating layer 112. The lower conductive lines 210 may be formed of or include at least one of conductive materials. For example, the conductive materials may be one of doped semiconductor materials (doped silicon, doped germanium, and so forth), conductive metal nitrides (titanium nitride, tantalum nitride, and so forth), metallic materials (tungsten, titanium, tantalum, and so forth), and metal-semiconductor compounds (tungsten silicide, cobalt silicide, titanium silicide, and so forth).

The lower conductive lines 210 may be spaced apart from each other by a distance that is larger than the distance between the capacitors 350. In detail, two adjacent ones of the lower conductive lines 210 may be spaced apart from each other by a first distance ds1 in the first direction D1, and two adjacent ones of the capacitors 350 may be spaced apart from each other by a second distance ds2 in the first direction D1. The first distance ds1 may be larger than the second distance ds2. For example, the first distance ds1 may be more than two times the second distance ds2. Furthermore, the first distance ds1 may be two or more times larger than a width of the capacitor 350 in the first direction D1.

The lower conductive lines 210 may be disposed below some of the capacitors 350 arranged in the second direction D2, as shown in FIG. 3B. The lower conductive lines 210 may be connected in common to a plurality of the capacitors 350, which are vertically overlapped with the lower conductive lines 210, through the lower channel structures 310 arranged in the second direction D2. The lower conductive lines 210 may not be disposed below some of the capacitors 350 arranged in the second direction D2, as shown in FIG. 3C.

A third lower insulating layer 132 may be disposed on the lower conductive lines 210 and the second lower insulating layer 112. A bottom surface of the third lower insulating layer 132 may be at the same vertical level as bottom surfaces of the lower channel structures 310. The third lower insulating layer 132 may be disposed between the lower conductive lines 210 and the lower gate lines 220 to electrically disconnect them from each other. The third lower insulating layer 132 may be extended in both of the first and second directions D1 and D2 to fully cover the top surfaces of the lower conductive lines 210 and the top surface of the second lower insulating layer 112. The third lower insulating layer 132 may include a silicon oxide layer, a silicon nitride layer, and/or a silicon oxynitride layer.

A fourth lower insulating layer 142 may be disposed on the third lower insulating layer 132. For example, a bottom surface of the fourth lower insulating layer 142 may contact a top surface of the third lower insulating layer 132. The fourth lower insulating layer 142 may have lower trenches 143 extending lengthwise in the first direction D1. The lower trenches 143 may be arranged in the second direction D2 and may be disposed below the capacitors 350. The fourth lower insulating layer 142 may include a silicon oxide layer, a silicon nitride layer, and/or a silicon oxynitride layer.

The lower gate lines 220 may be disposed in the fourth lower insulating layer 142. For example, bottom surfaces of the lower gate lines 220 may contact a top surface of the fourth lower insulating layer 142. The lower gate lines 220 may be vertically spaced apart from the lower conductive line 210. The lower gate lines 220 may be disposed in the lower trenches 143 and may be extended lengthwise in the first direction D1. The lower gate lines 220 may be disposed spaced apart from each other in the second direction D2. The lower gate lines 220 may be formed of or include at least one of conductive materials. For example, the conductive materials may be one of doped semiconductor materials (doped silicon, doped germanium, and so forth), conductive metal nitrides (titanium nitride, tantalum nitride, and so forth), metallic materials (tungsten, titanium, tantalum, and so forth), and metal-semiconductor compounds (tungsten silicide, cobalt silicide, titanium silicide, and so forth).

The lower gate lines 220 may be spaced apart from each other by a distance that is smaller than the distance between the lower conductive lines 210. In detail, a distance ds4 between two adjacent one of the lower gate lines 220 in the second direction D2 may be smaller than the distance ds1 between two adjacent one of the lower conductive lines 210 in the first direction D1. In an example embodiment, the lower gate lines 220 may be disposed below all of the capacitors 350.

A lower insulating pattern 222 may be disposed on the lower gate lines 220. For example, a bottom surface of the lower insulating pattern 222 may contact top surfaces of the lower gate lines 220. The lower insulating pattern 222 may be a capping pattern, which is formed to fill an upper portion of the lower trench 143 and thereby to electrically disconnect the lower gate lines 220 from the first electrode 354 of the capacitor 350. The lower insulating pattern 222 may include a silicon oxide layer, a silicon nitride layer, and/or a silicon oxynitride layer. The lower insulating pattern 222 may fill a remaining region of the lower trench 143 that is partially filled with the lower gate line 220. A top surface of the lower insulating pattern 222 may be located at the same vertical level as a top surface of the fourth lower insulating layer 142 and top surfaces of the lower channel structures 310. The lower insulating patterns 222 may be extended lengthwise in the first direction D1 and may be arranged in the second direction D2.

An interlayer insulating layer 150 may be disposed on the fourth lower insulating layer 142 and the lower insulating pattern 222. For example, a bottom surface of the interlayer insulating layer 150 may contact top surfaces of the fourth lower insulating layer 142 and the lower insulating pattern 222. A thickness of the interlayer insulating layer 150 in the third direction D3 may be thicker than the first to fourth lower insulating layers 102, 112, 132, and 142. The interlayer insulating layer 150 may have vertical holes 151, which are formed to vertically penetrate the same. The vertical holes 151 may be arranged in the first and second directions D1 and D2.

The capacitors 350 may be disposed in the vertical holes 151 of the interlayer insulating layer 150. The capacitors 350 may be disposed between the lower gate lines 220 and the upper gate lines 230 and may be vertically overlapped with the lower gate lines 220 and the upper gate lines 230. The capacitors 350 may be arranged on the lower gate lines 220 and may be extended in the third direction D3. When viewed in a plan view, the capacitors 350 may be disposed at intersections of the lower conductive line 210 and the lower gate line 220 or intersections of the upper conductive line 240 and the upper gate line 230. Each of the capacitors 350 may include the first electrode 354, a dielectric layer 356, and the second electrode 352.

A portion of the first electrode 354 may be connected to the lower conductive line 210 through the lower channel structure 310. The portion of the first electrode 354 may receive electric charges from the lower conductive line 210 through the lower semiconductor pattern 312 of the lower channel structure 310. The second electrode 352 may be provided to fill an internal space of the first electrode 354.

Each of the first and second electrodes 354 and 352 may be formed of or include at least one of metallic materials (e.g., titanium, tantalum, tungsten, copper, or aluminum), conductive metal nitrides (e.g., titanium nitride or tantalum nitride), or doped semiconductor materials (e.g., doped silicon or doped germanium). The dielectric layer 356 may be formed of or include high-k dielectric materials (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof).

The dielectric layer 356 may cover top and inner surfaces of the first electrode 354, and may contact the top and inner surfaces of the first electrode 354. The dielectric layer 356 may cover lower and side surfaces of the second electrode 352, and may contact the lower and side surfaces of the second electrode 352.

A first upper insulating layer 162 may be provided to cover the interlayer insulating layer 150 and the capacitors 350. For example, a bottom surface of the first upper insulating layer 162 may contact top surfaces of the interlayer insulating layer 150 and the capacitors 350. The bottom surface of the first upper insulating layer 162 may be at the same vertical level as bottom surfaces of the upper channel structures 320. The first upper insulating layer 162 may be disposed between the upper gate line 230 and the capacitors 350 to electrically disconnect them from each other.

A second upper insulating layer 172 may be disposed on the first upper insulating layer 162. For example, a bottom surface of the second upper insulating layer 172 may contact a top surface of the first upper insulating layer 162. The second upper insulating layer 172 may include upper trenches 173 extending lengthwise in the first direction D1.

The upper gate lines 230 may be provided in the upper trenches 173. The upper gate lines 230 may be spaced apart from each other in the first direction D1 and may be extended lengthwise in the second direction D2. The upper gate lines 230 may be formed of or include at least one of conductive materials. For example, the conductive materials may be one of doped semiconductor materials (doped silicon, doped germanium, and so forth), conductive metal nitrides (titanium nitride, tantalum nitride, and so forth), metallic materials (tungsten, titanium, tantalum, and so forth), and metal-semiconductor compounds (tungsten silicide, cobalt silicide, titanium silicide, and so forth).

An upper insulating pattern 232 may be disposed on the upper gate lines 230. The upper insulating pattern 232 may be a capping pattern, which is formed to fill an upper portion of the upper trench 173 and thereby to electrically disconnect the upper gate lines 230 from the upper conductive line 240. The upper insulating pattern 232 may include a silicon oxide layer, a silicon nitride layer, and/or a silicon oxynitride layer. The upper insulating pattern 232 may fill a remaining region of the upper trench 173 that is partially filled with the upper gate line 230. A top surface of the upper insulating pattern 232 may be located at the same vertical level as a top surface of the second upper insulating layer 172 and top surfaces of the upper channel structures 320. The upper insulating patterns 232 may be extended lengthwise in the first direction D1 and may be arranged in the second direction D2.

A third upper insulating layer 182 may be provided on the upper insulating patterns 232 and the second upper insulating layer 172. For example, a bottom surface of the third upper insulating layer 182 may contact top surfaces of the upper insulating patterns 232 and the second upper insulating layer 172. The third upper insulating layer 182 may cover side surfaces of the upper conductive lines 240, contacting the side surfaces of the upper conductive lines 240. The third upper insulating layer 182 may include a silicon oxide layer, a silicon nitride layer, and/or a silicon oxynitride layer.

Figure 4:
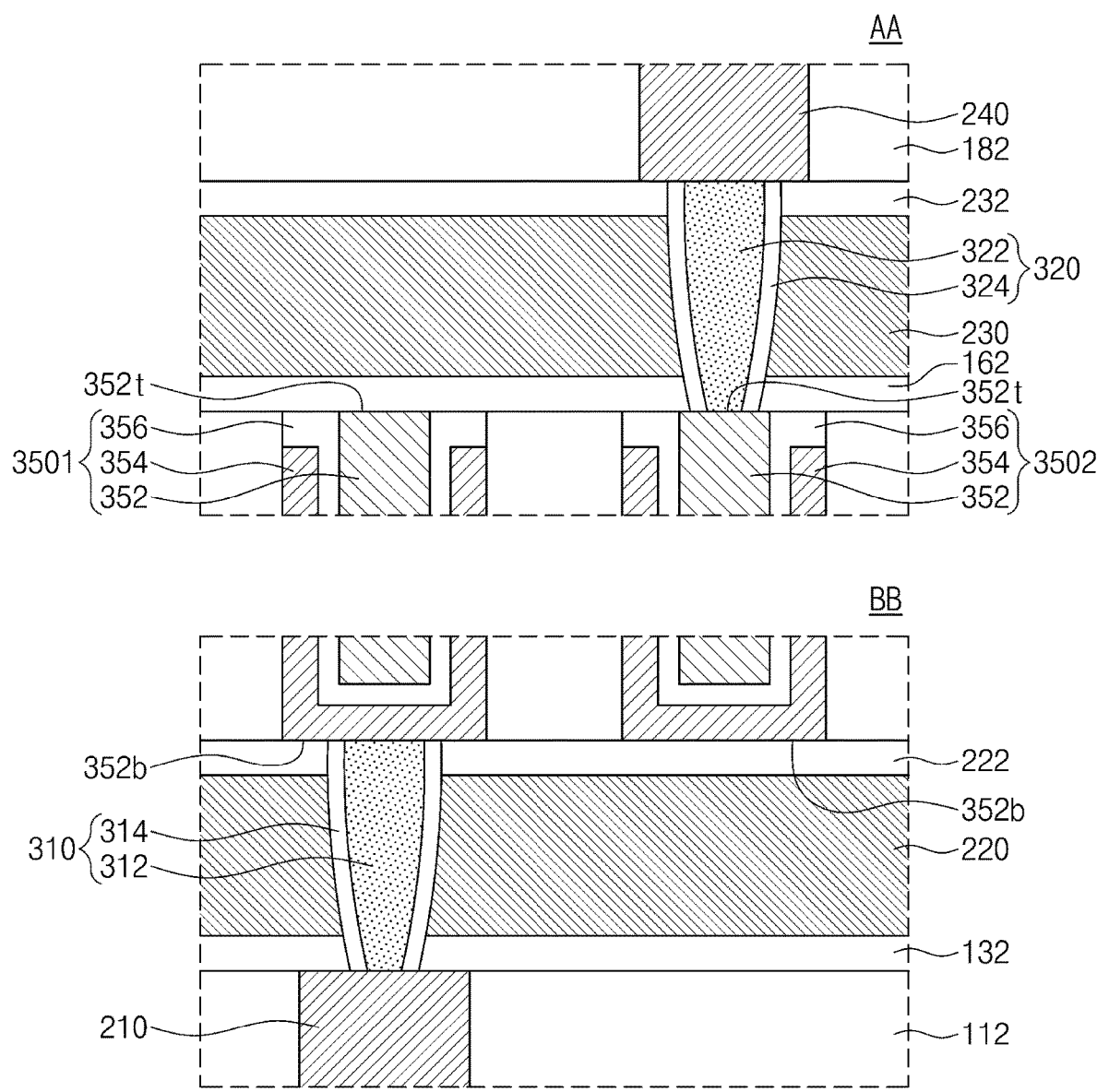
FIG. 4 is an enlarged sectional view illustrating portions (e.g., corresponding to portions AA and BB of FIG. 3A) of a semiconductor memory device, according to an example embodiment of the inventive concept.

FIG. 4 is an enlarged sectional view illustrating portions (e.g., corresponding to portions AA and BB of FIG. 3A) of a semiconductor memory device according to an example embodiment of the inventive concept.

Referring to FIGS. 3A and 4, the capacitors 350 may include a first capacitor 3501 connected to the lower channel structure 310 and a second capacitor 3502 connected to the upper channel structure 320. The first capacitor 3501 and the second capacitor 3502 may be disposed between the lower gate line 220 and the upper gate line 230. The first capacitor 3501 and the second capacitor 3502 may be spaced apart from each other in the first direction D1 or the extension direction of the lower gate line 220. The first capacitor 3501 and the second capacitor 3502 may be vertically overlapped with the lower gate line 220 and the upper gate line 230.

The first electrode 354 of the first capacitor 3501 may be connected to the lower conductive line 210 through the lower semiconductor pattern 312 of the lower channel structure 310. And the top surface 352t of the second electrode 352 of the first capacitor 3501 may be entirely covered by the first upper insulating layer 162. The second electrode 352 of the second capacitor 3502 may be connected to the upper conductive line 240 through the upper semiconductor pattern 322 of the upper channel structure 320. And the bottom surface 352b of the first electrode 354 of the second capacitor 3502 may be entirely covered by the lower insulating pattern 222.

FIGS. 5, 7, 9, 11, 13, 15, 17, 19, and 21 are plan views illustrating a method of fabricating a semiconductor memory device, according to an example embodiment of the inventive concept. FIGS. 6A, 8A, 10A, 12A, 14A, 16A, 18A, 20A, and 22A are sectional views taken along lines I-I' of FIGS. 5, 7, 9, 11, 13, 15, 17, 19 and 21, respectively. FIGS. 6B, 8B, 10B, 12B, 14B, 16B, 18B, 20B, and 22B are sectional views taken along lines II-IP of FIGS. 5, 7, 9, 11, 13, 15, 17, 19 and 21, respectively.

Figure 5:
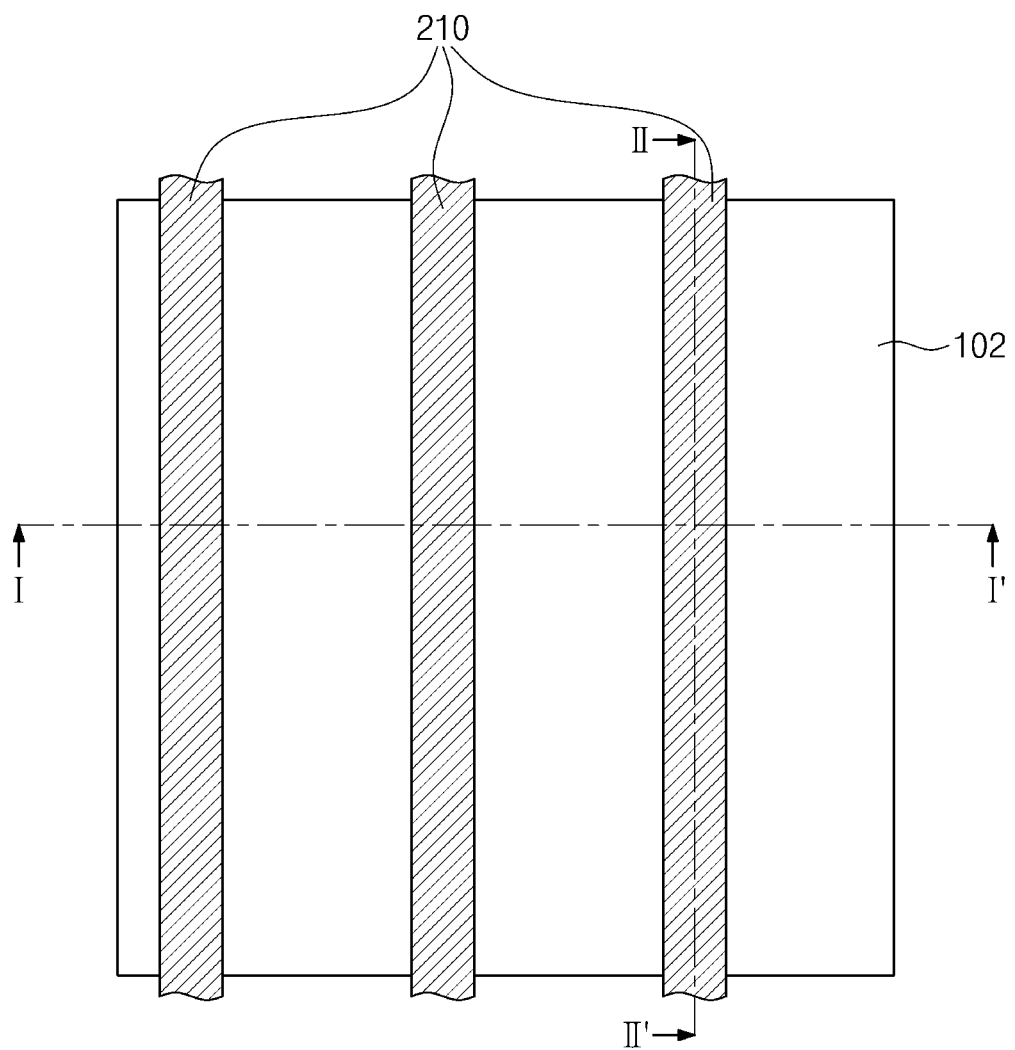

Referring to FIGS. 5, 6A, and 6B, the first lower insulating layer 102 may be formed on the substrate 100, and the lower conductive lines 210 may be formed on the first lower insulating layer 102. The first lower insulating layer 102 may include at least one of a silicon oxide layer, a silicon nitride layer, a silicon oxynitride layer, a carbon-containing silicon oxide layer, a carbon-containing silicon nitride layer, or a carbon-containing silicon oxynitride layer. The formation of the lower conductive lines 210 may include forming a metal layer to cover the first lower insulating layer 102 and patterning the metal layer.

Referring to FIGS. 7, 8A, and 8B, the second lower insulating layer 112, the third lower insulating layer 132, and the fourth lower insulating layer 142 may be formed. The formation of the second lower insulating layer 112 may include forming an insulating layer to cover side and top surfaces of the lower conductive line 210 and removing a portion of the insulating layer such that the insulating layer has a top surface located at the same level as the top surfaces of the lower conductive lines 210. The third lower insulating layer 132 may be formed to cover the top surfaces of the lower conductive lines 210 and the top surface of the second lower insulating layer 112. The third lower insulating layer 132 may be formed to have a smaller thickness than the second lower insulating layer 112. Thickness may refer to the thickness or height measured in a direction perpendicular to the top surface of the substrate 100 (e.g., the third direction D3).

The fourth lower insulating layer 142 may be formed on the third lower insulating layer 132. The formation of the fourth lower insulating layer 142 may include forming an insulating layer to cover the third lower insulating layer 132 and patterning the insulating layer to form the lower trenches 143 extending in the first direction D1.

Thereafter, first sacrificial patterns 221 may be formed in the lower trenches 143 of the fourth lower insulating layer 142. The first sacrificial patterns 221 may be formed of or include at least one of materials, which are chosen to have an etch selectivity with respect to the third lower insulating layer 132 and the fourth lower insulating layer 142. As an example, the third lower insulating layer 132 and the fourth lower insulating layer 142 may be formed silicon oxide, and the first sacrificial patterns 221 may be formed of or include silicon nitride.

Figure 9:
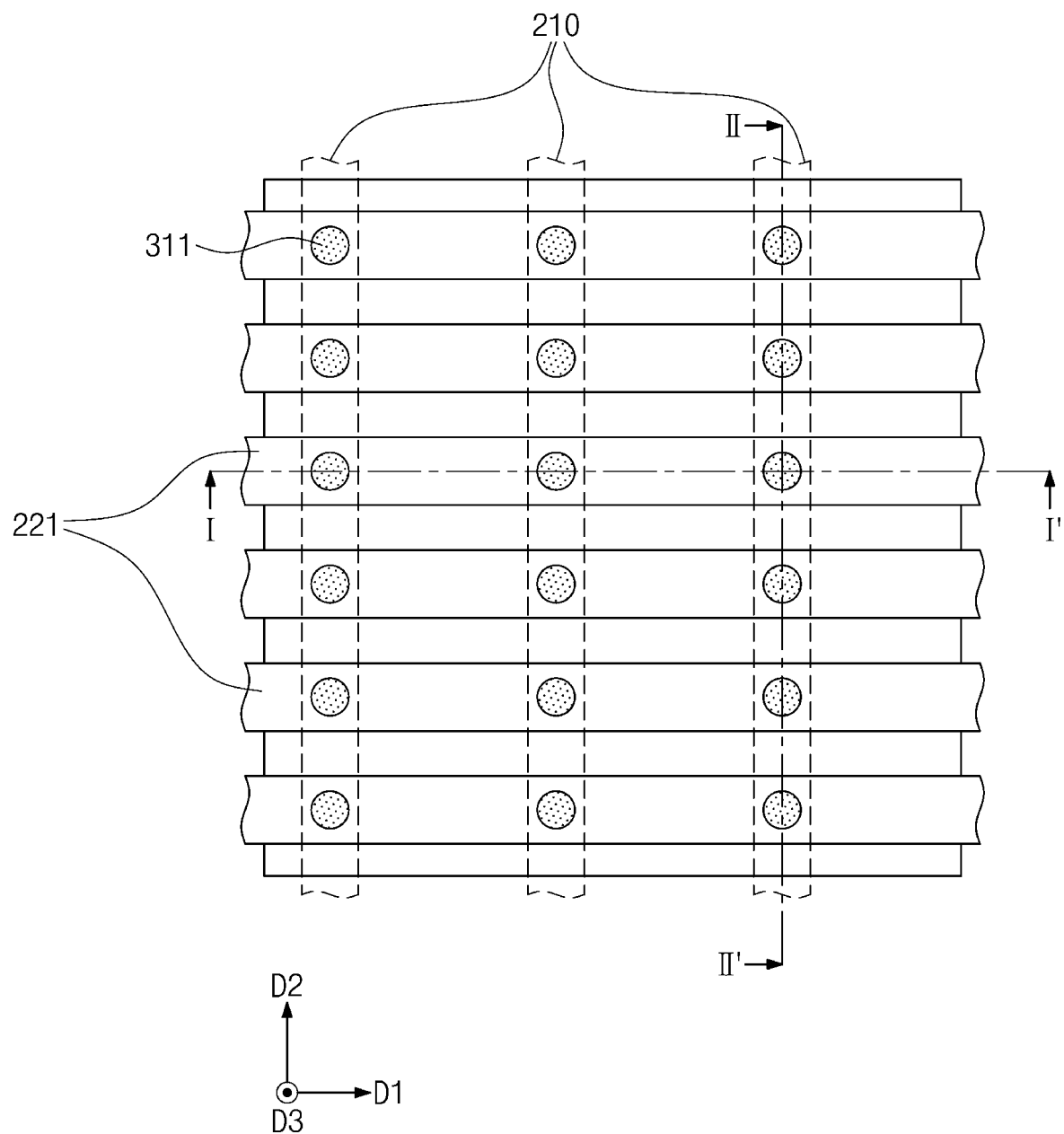

Referring to FIGS. 9, 10A, and 10B, second sacrificial patterns 311 may be formed on the lower conductive lines 210. The second sacrificial patterns 311 may be formed to penetrate the first sacrificial pattern 221 and the third lower insulating layer 132 and to be in contact with the top surfaces of the lower conductive lines 210. Top surfaces of the second sacrificial patterns 311 may be located at the same vertical level as the top surfaces of the fourth lower insulating layer 142 and the first sacrificial patterns 221. The second sacrificial patterns 311 may have a truncated-cone or cylinder shape having a downwardly decreasing width. The second sacrificial patterns 311 may be formed of or include at least one of materials that are chosen to have an etch selectivity with respect to the first sacrificial pattern 221. As an example, the first sacrificial pattern 221 may be formed of or include silicon nitride, and the second sacrificial pattern 311 may be formed of or include silicon oxide.

Figure 11:
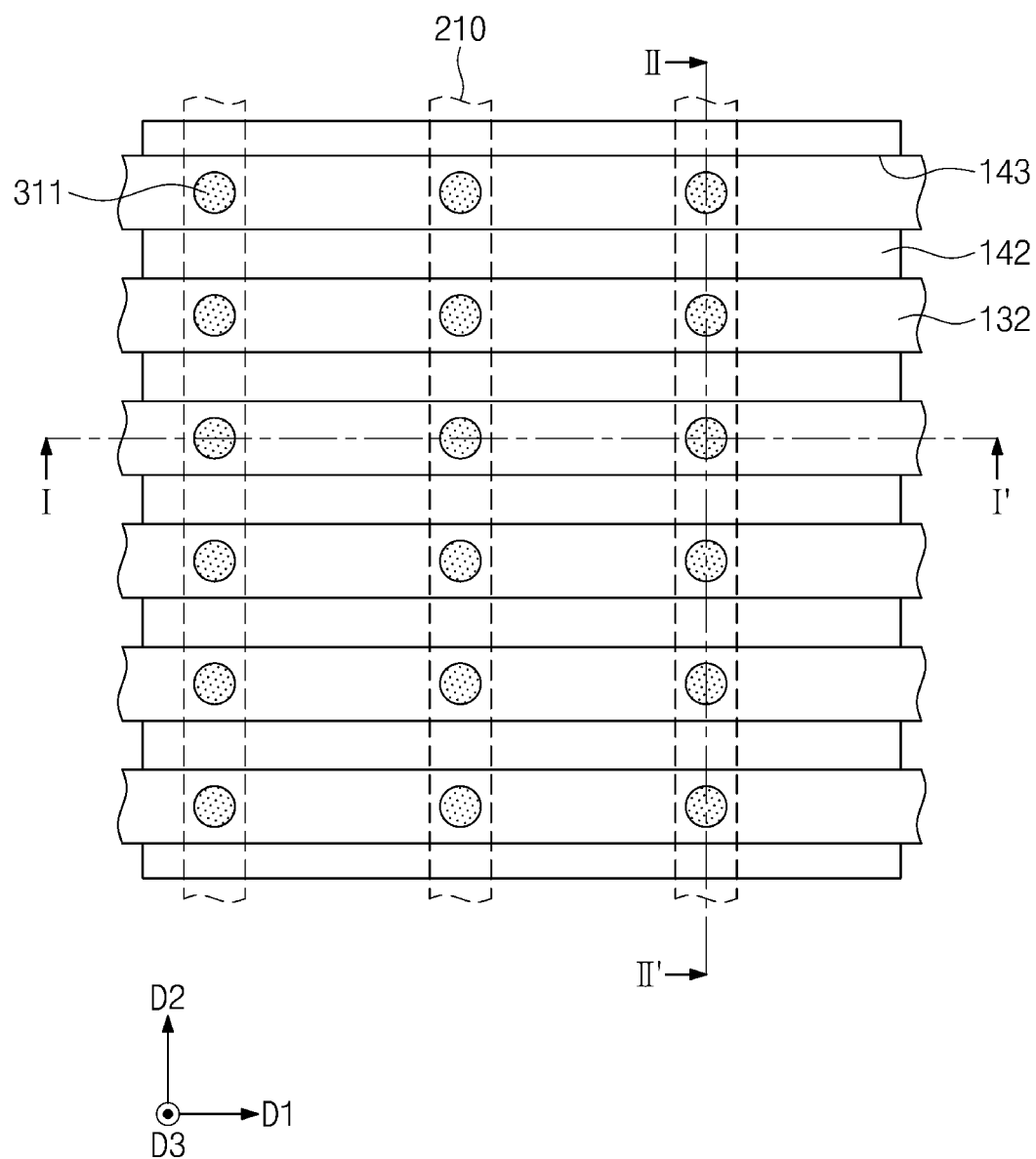

Referring to FIGS. 11, 12A, and 12B, the first sacrificial patterns 221 may be removed. Inner surfaces of the lower trench 143 and side surfaces of the second sacrificial patterns 311 may be exposed as a result of the removal of the first sacrificial patterns 221.

Figure 13:
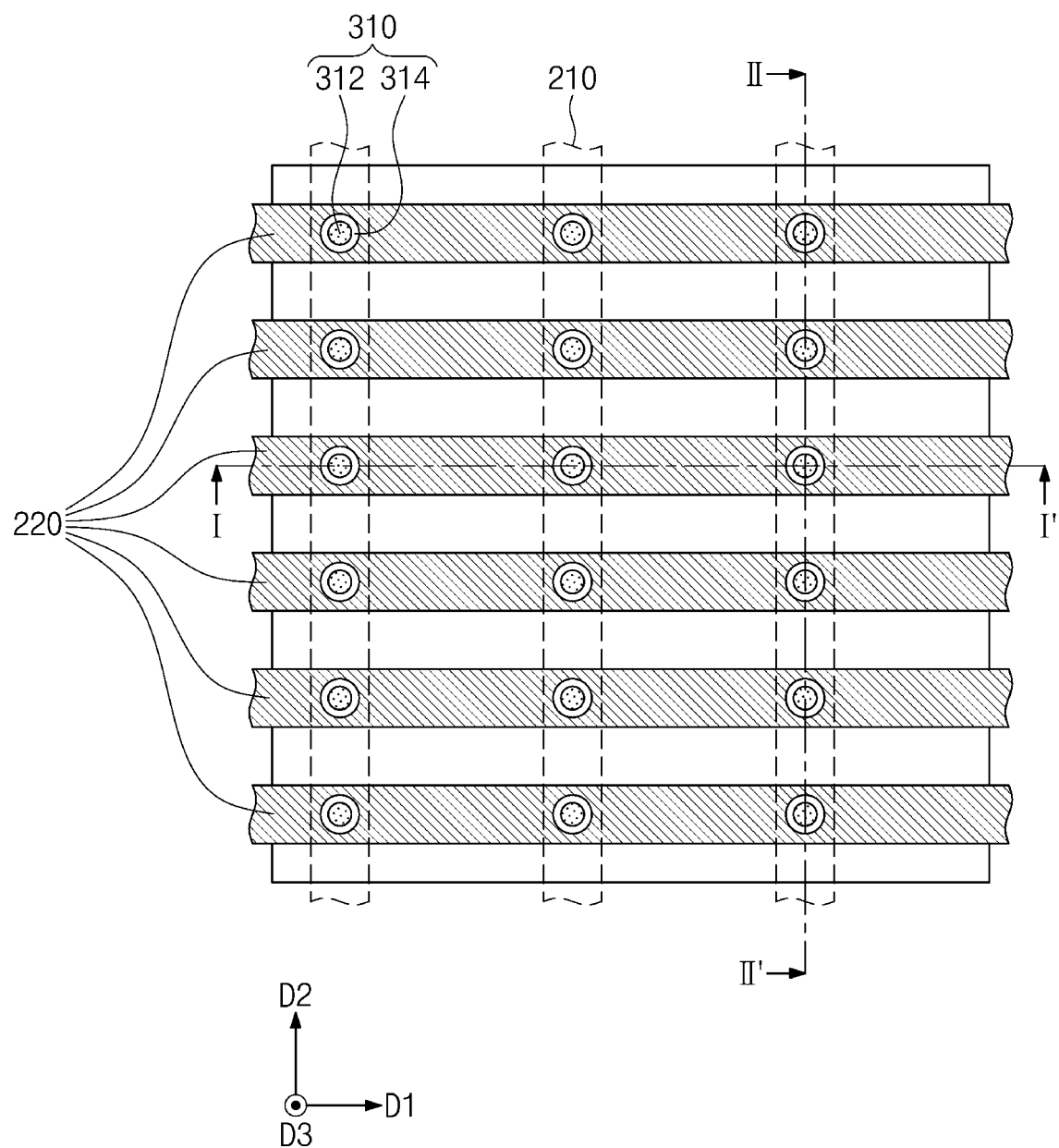

Referring to FIGS. 13, 14A, and 14B, the lower gate line 220 and the lower channel structure 310 may be formed in the lower trench 143.

The lower gate line 220 may be formed in the lower trench 143. The formation of the lower gate line 220 may include performing a deposition process to form a conductive layer filling the lower trench 143 and performing an etching process to partially remove the conductive layer.

Thereafter, a lower channel hole 313 may be formed in the lower gate line 220 and the third lower insulating layer 132 by removing the second sacrificial patterns 311. The lower channel hole 313 may have a downwardly decreasing width.

The lower gate insulating pattern 314 may be formed to conformally cover an inner side surface of the lower channel hole 313, and the lower semiconductor pattern 312 may be formed to fill a remaining region of the lower channel hole 313. The lower semiconductor pattern 312 may be formed using a deposition process. The deposition process to form the lower semiconductor pattern 312 may include one of, for example, a physical vapor deposition (PVD) process, a chemical vapor deposition (CVD) process, and an atomic layer deposition (ALD) process. According to an example embodiment of the inventive concept, an impurity doping process may be performed during the deposition process to form the lower semiconductor pattern 312. For example, the impurity doping process may be performed in-situ in the same chamber as that for the deposition process. According to an example embodiment of the inventive concept, the lower semiconductor pattern 312 may be formed of or include at least one of undoped or intrinsic semiconductor materials. In this case, the impurity doping process may be omitted.

Figure 15:
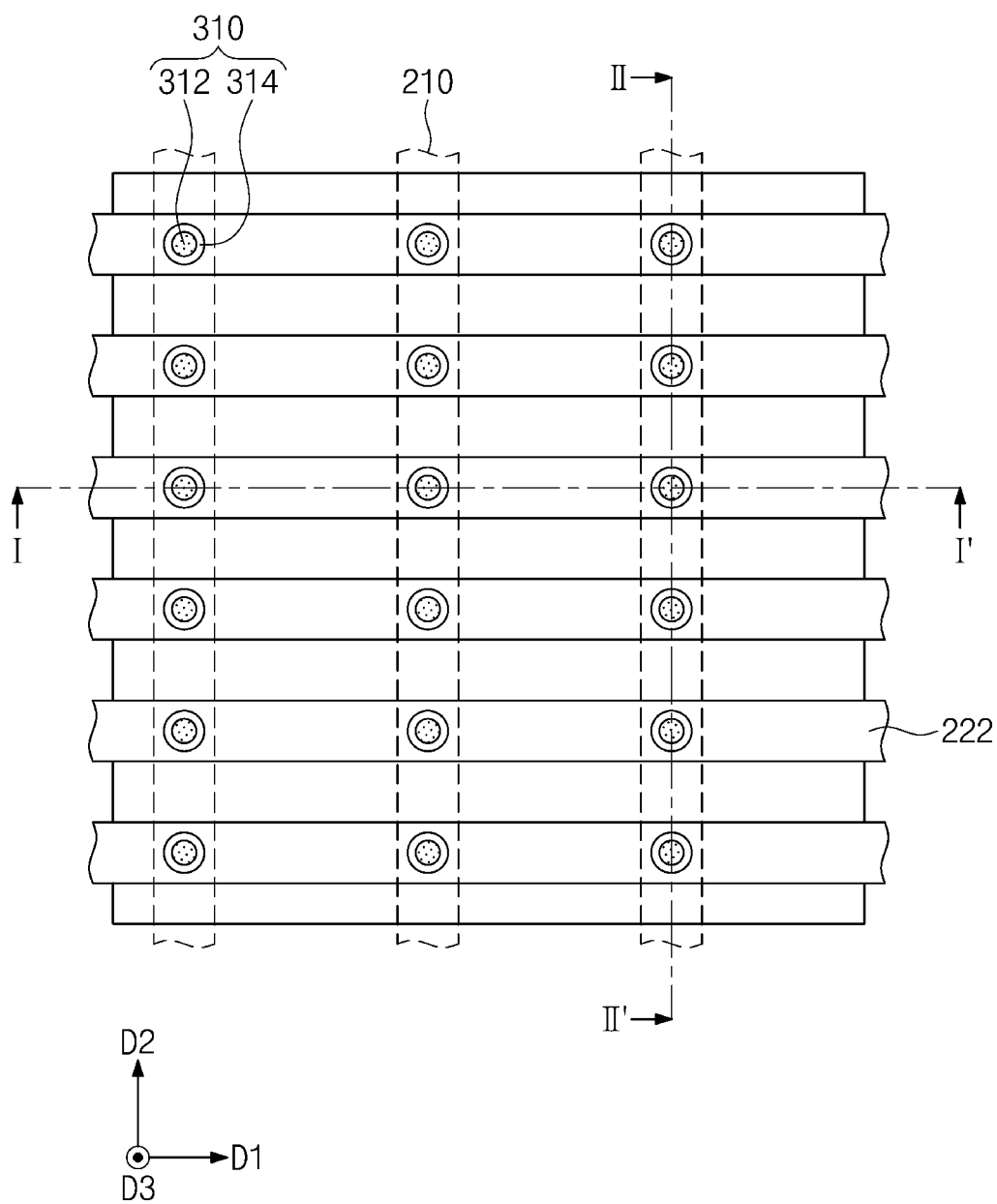

Referring to FIGS. 15, 16A, and 16B, a portion of the lower gate line 220 may be recessed, and then the lower insulating pattern 222 may be formed in the lower trench 143. As a result of the partial recess of the lower gate line 220, a top surface of the lower gate line 220 may be positioned at a vertical level lower than the top surface of the fourth lower insulating layer 142. The lower insulating pattern 222 may be formed in an upper portion of the lower trench 143. The lower insulating patterns 222 may be extended lengthwise in the first direction D1 and may be arranged in the second direction D2. The lower insulating pattern 222 may be formed to fill a remaining region the lower trench 143, and the top surface of the lower insulating pattern 222 may be located at the same vertical level as the top surface of the fourth lower insulating layer 142.

Figure 17:
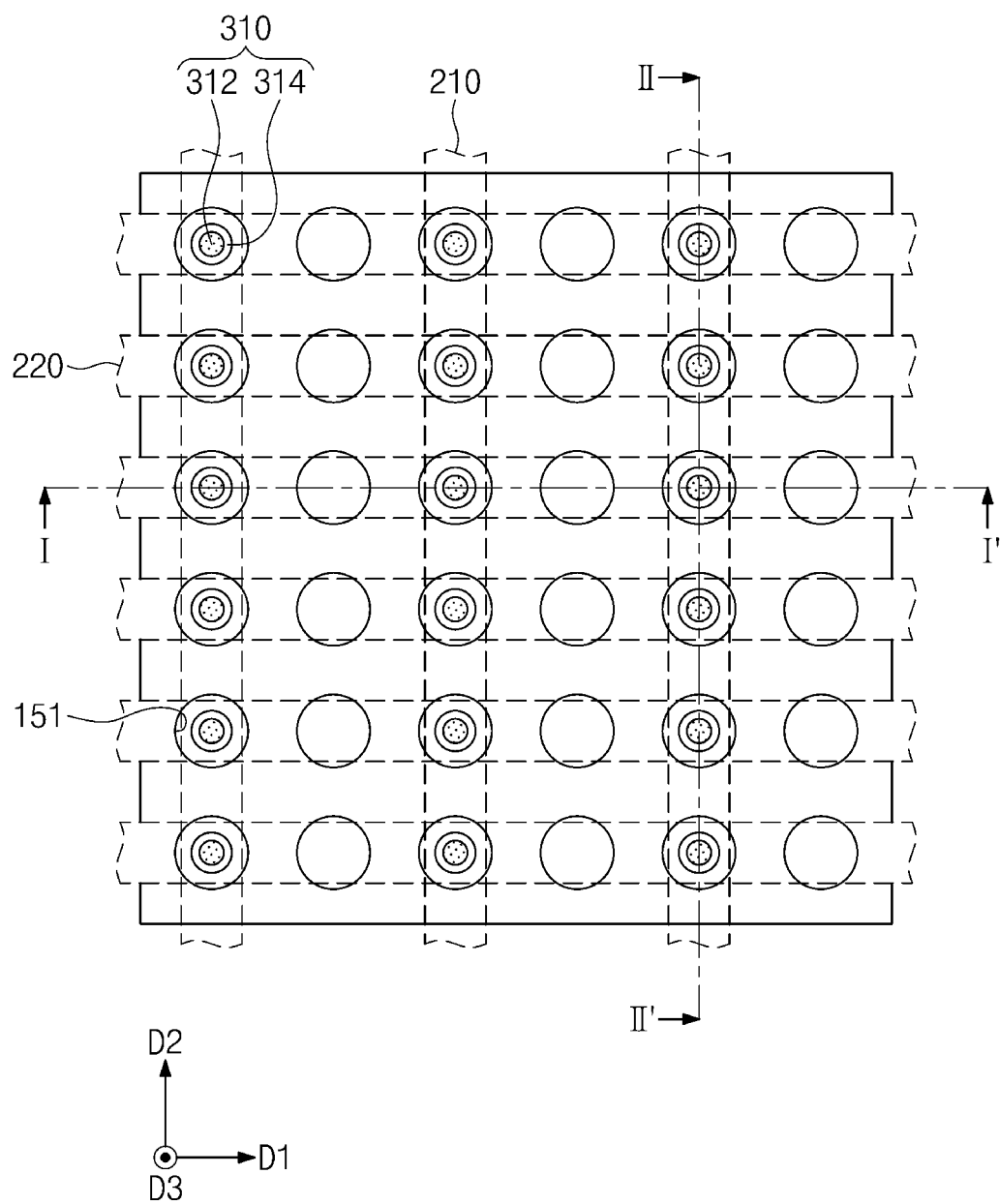
Figure 18B:
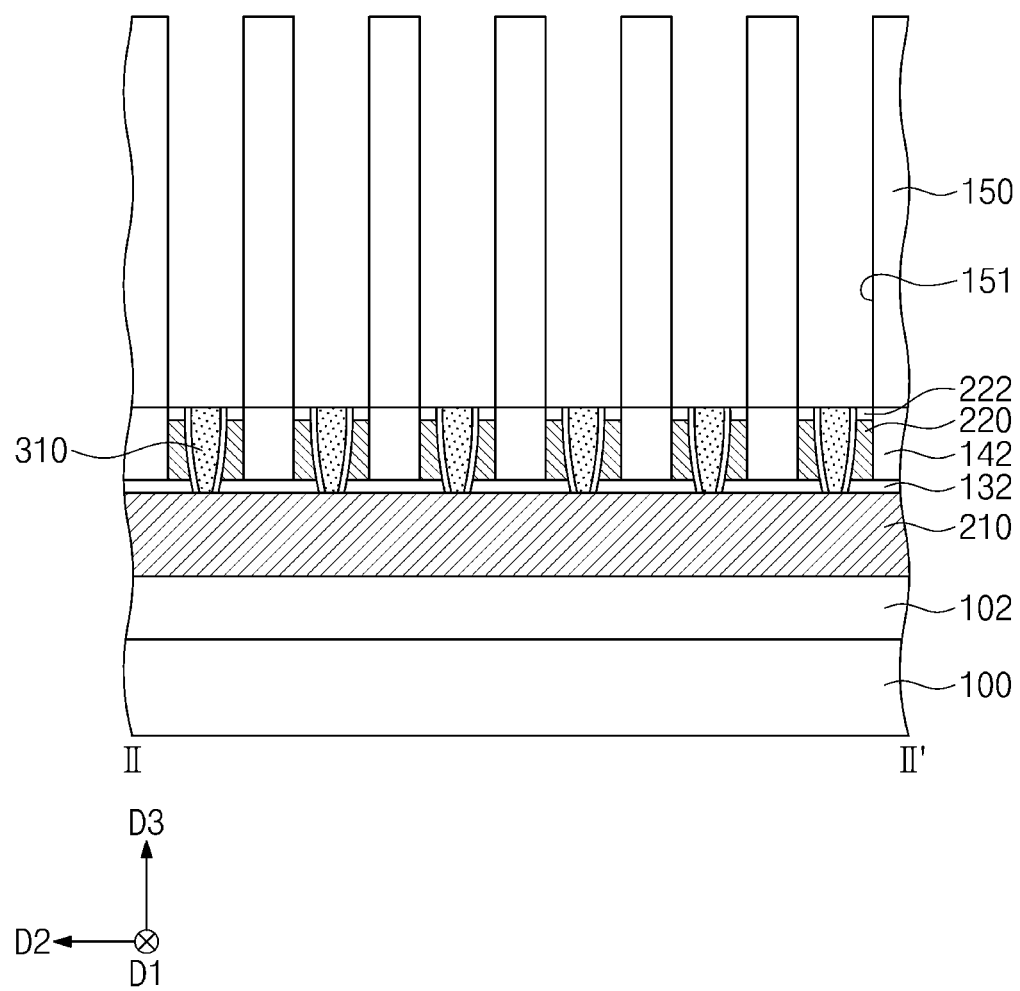

Referring to FIGS. 17, 18A, and 18B, the interlayer insulating layer 150 may be formed on the fourth lower insulating layer 142. Thereafter, an etching process may be performed on the interlayer insulating layer 150 to form the vertical holes 151 penetrating the interlayer insulating layer 150 in the third direction D3. The vertical holes 151 may be arranged on the lower gate lines 220. Some of the vertical holes 151 may vertically overlap the lower conductive lines 210, whereas others of the vertical holes 151 may not vertically overlap the lower conductive lines 210. The vertical holes 151 that vertically overlap the lower conductive lines 210 may be formed to expose a top surface of the lower channel structure 310. The vertical holes 151, which do not vertically overlap the lower conductive lines 210, may expose the top surface of the lower insulating pattern 222.

Figure 19:
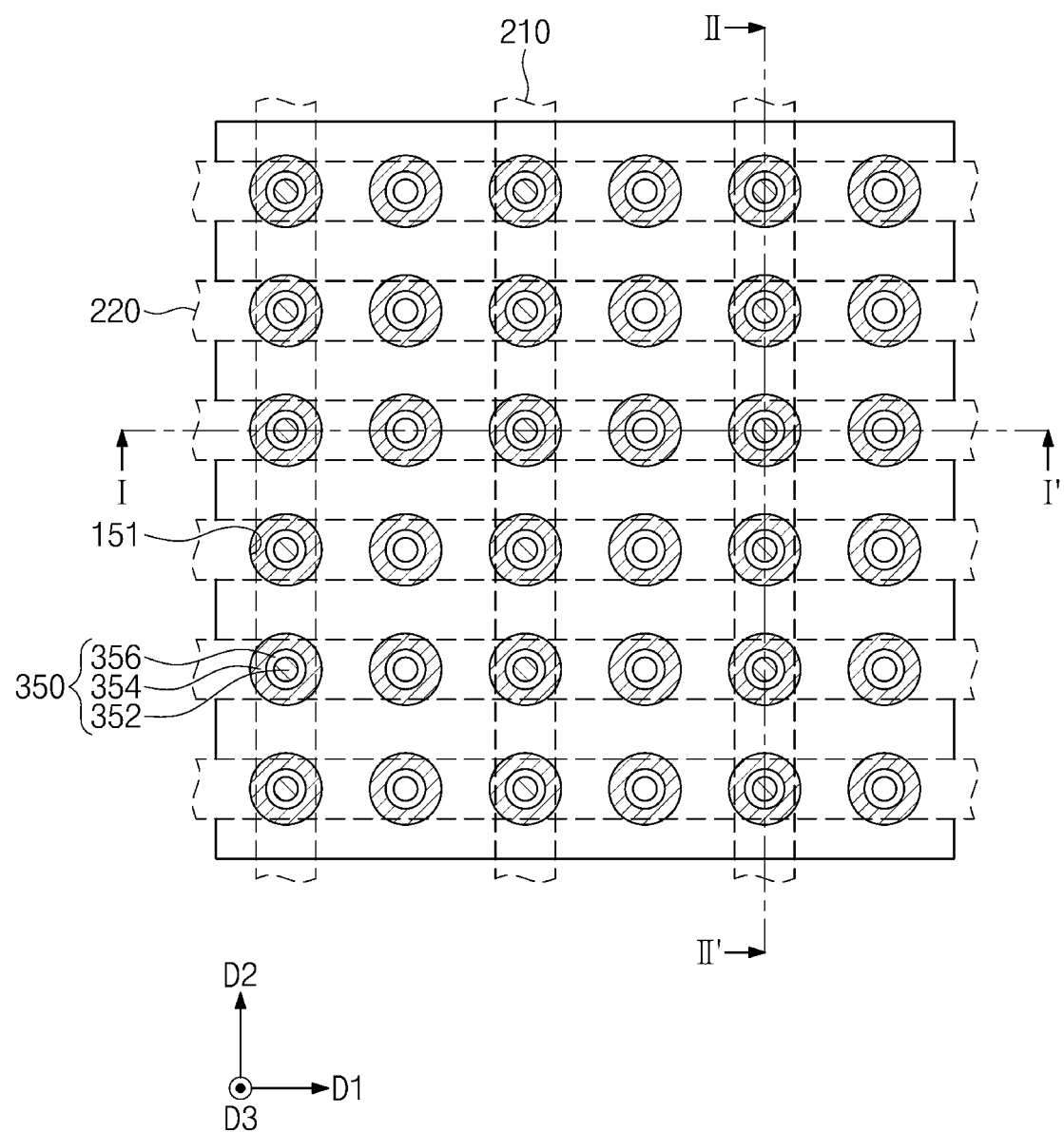
Figure 20A:
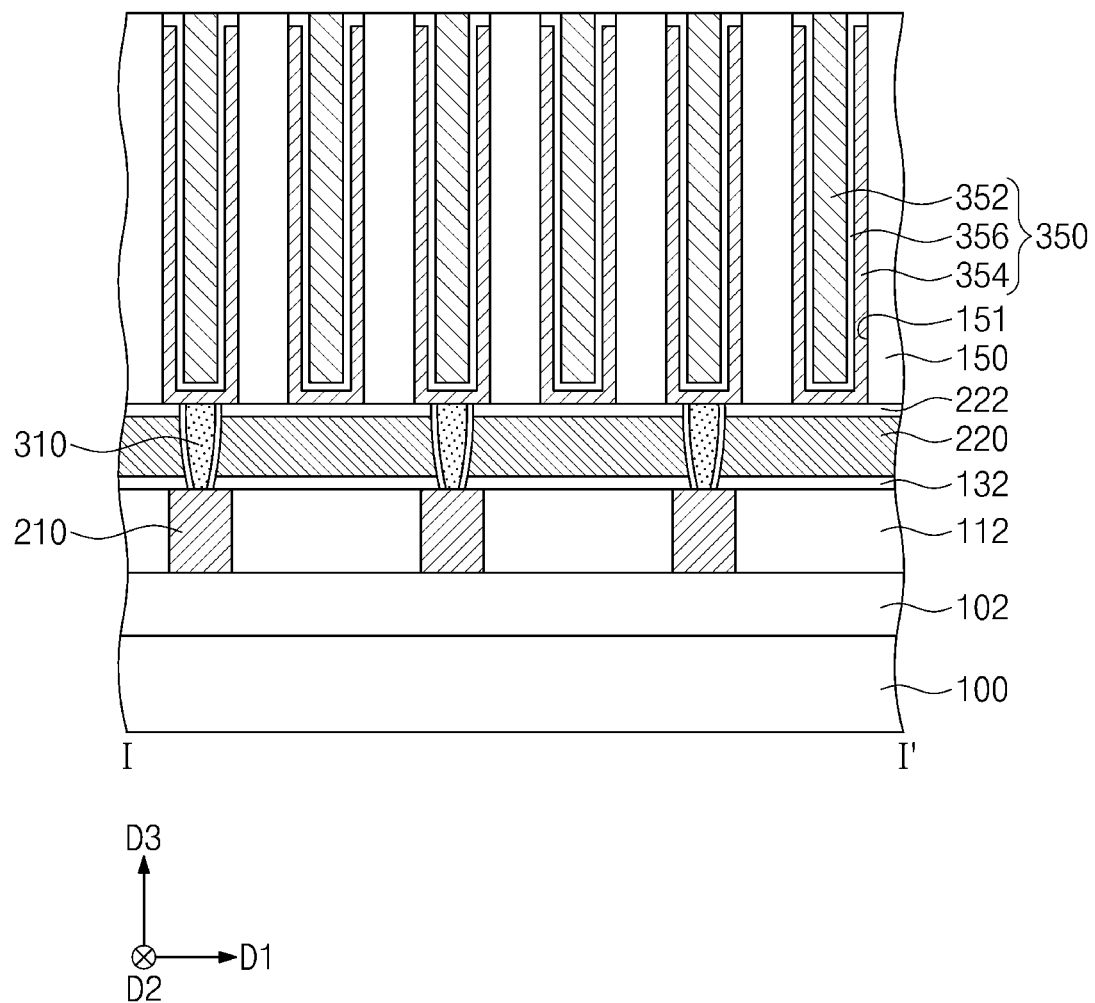
Figure 20B:
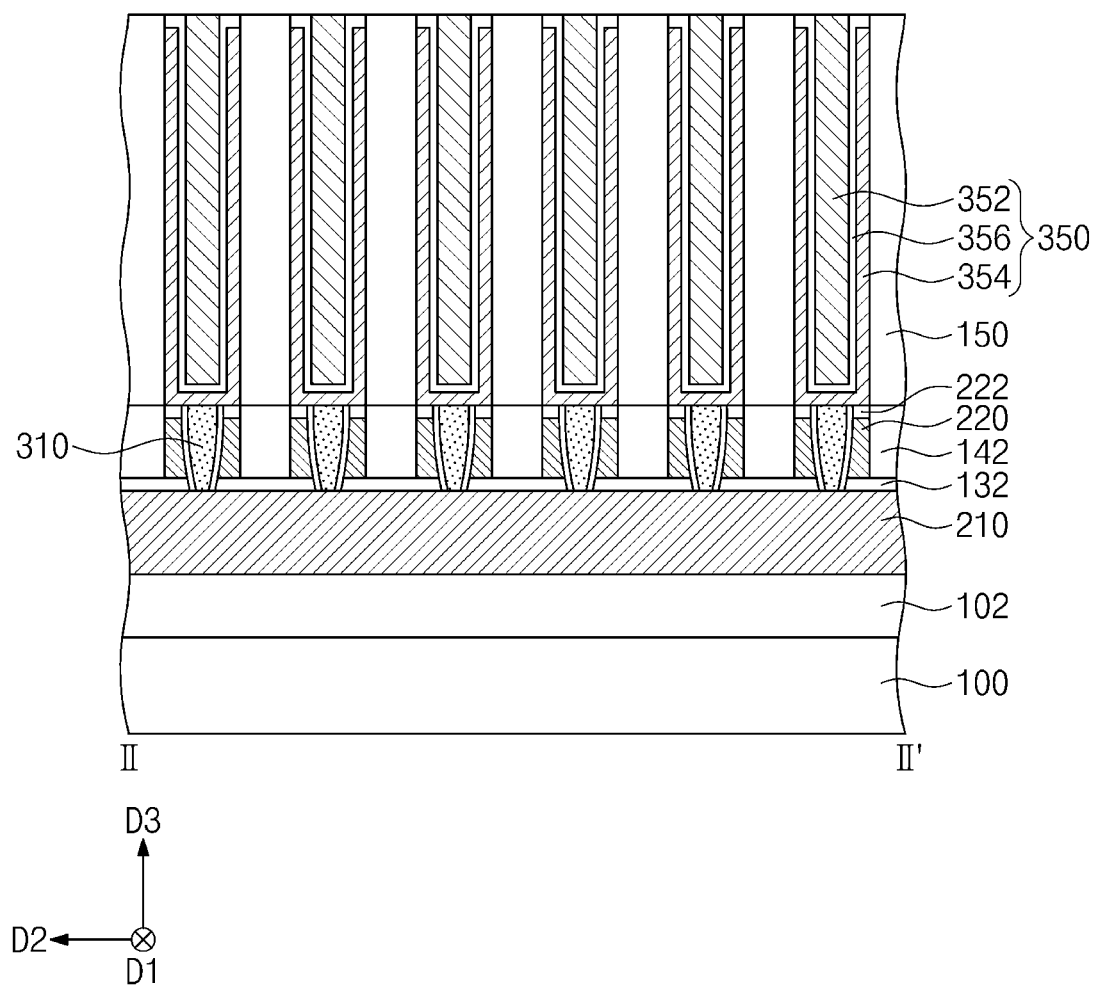

Referring to FIGS. 19, 20A, and 20B, the capacitors 350 may be formed in the vertical holes 151. Each of the capacitors 350 may include the first electrode 354 conformally covering an inner side surface of the vertical hole 151, the second electrode 352 inserted in the first electrode 354, and the dielectric layer 356 interposed between the first electrode 354 and the second electrode 352.

Figure 21:
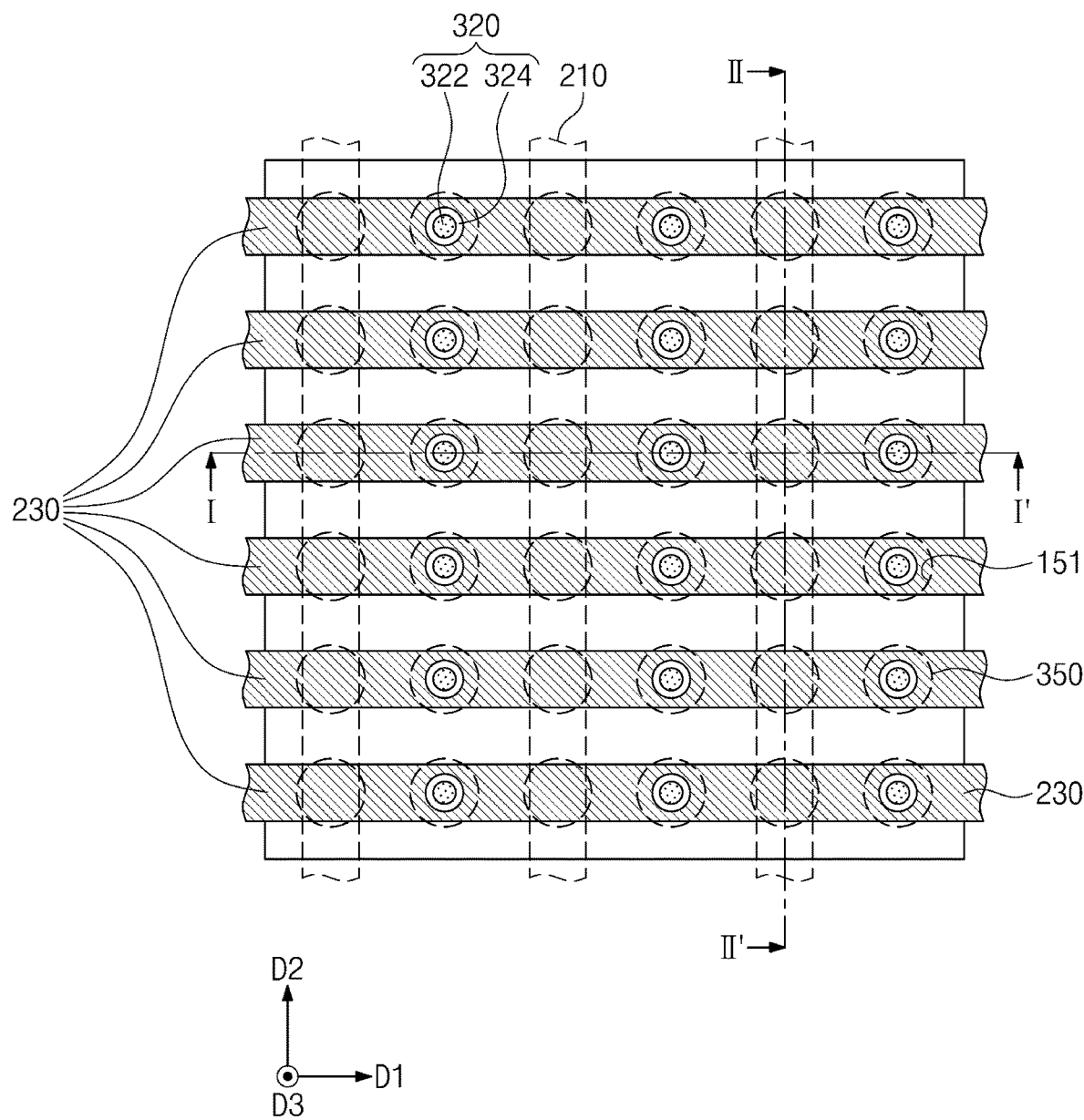
Figure 22B:
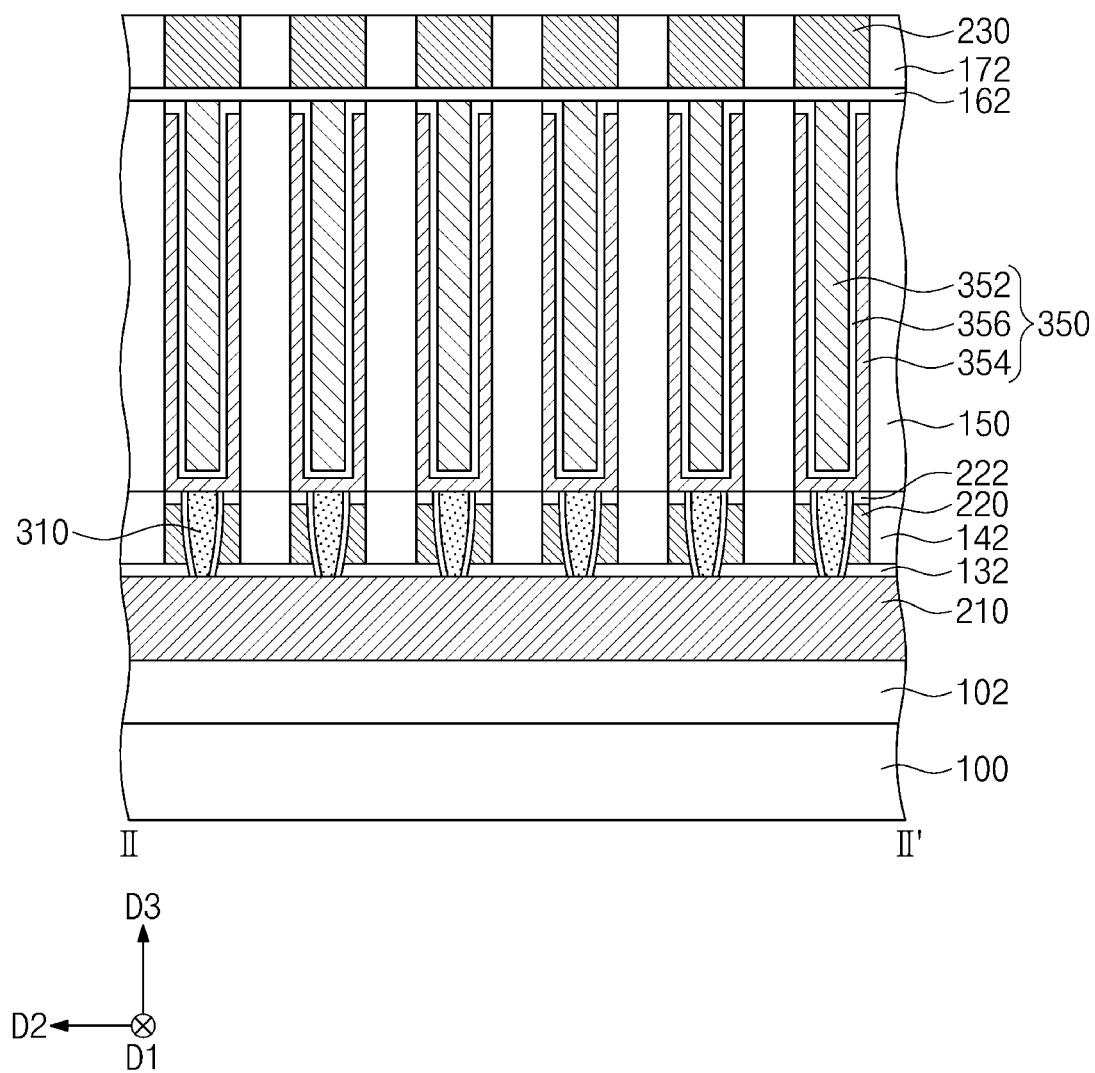

Referring to FIGS. 21, 22A, and 22B, the first upper insulating layer 162 may be formed on the capacitors 350 and the interlayer insulating layer 150. The first upper insulating layer 162 may be formed to fully cover top surfaces of the capacitors 350 and a top surface of the interlayer insulating layer 150.

Next, the second upper insulating layer 172 may be formed, and then, the upper gate lines 230 and the upper channel structure 320 may be formed in the second upper insulating layer 172. A distance between top and bottom surfaces of the upper gate insulating pattern 324 may be larger than a thickness of the upper gate lines 230. The process of forming the upper gate lines 230 and the upper channel structure 320 may be performed by the same method as that for the lower gate lines 220 and the lower channel structure 310 described with reference to FIGS. 7 to 14B.

Referring back to FIGS. 2, 3A, 3B, and 3C, the third upper insulating layer 182 may be formed, and the upper conductive lines 240 may be formed in the third upper insulating layer 182. The upper insulating patterns 232 may be formed on the upper gate lines 230, before the formation of the third upper insulating layer 182 and the upper conductive lines 240. The upper insulating pattern 232 may be formed to fill an upper portion of the upper trench 173. Next, the third upper insulating layer 182 and the upper conductive lines 240 may be formed on the top surfaces of the upper insulating patterns 232 and the top surface of the second upper insulating layer 172. In an example embodiment, the third upper insulating layer 182 may be formed by performing a deposition process on the top surfaces of the upper insulating patterns 232 and the top surface of the second upper insulating layer 172. Thereafter, the upper conductive lines 240 may be formed in the third upper insulating layer 182. In certain embodiments, the upper conductive lines 240 may be formed before the formation of the third upper insulating layer 182.

Figure 23:
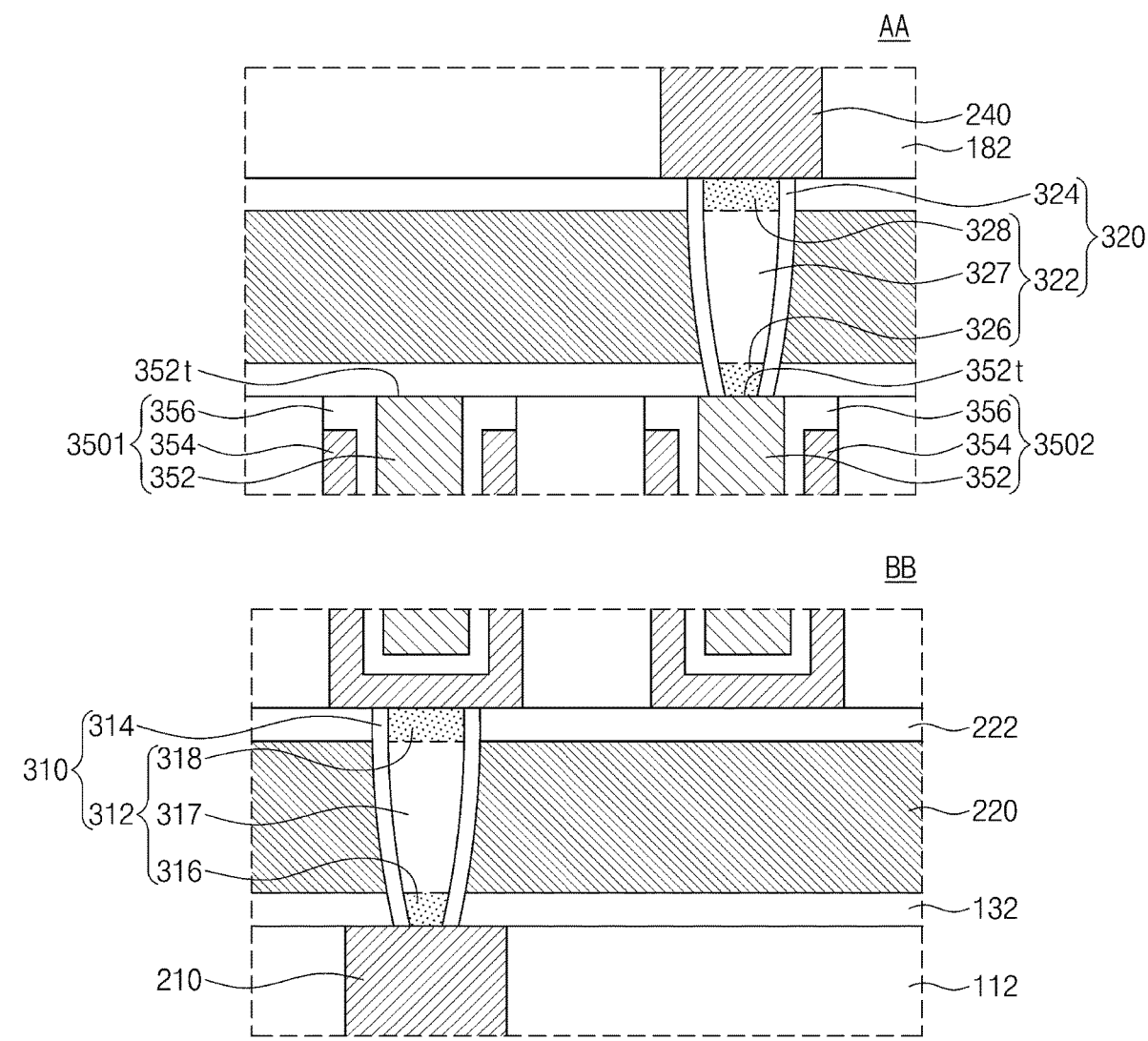
FIG. 23 is an enlarged sectional view illustrating portions (e.g., corresponding to portions AA and BB of FIG. 3A) of a semiconductor memory device, according to an example embodiment of the inventive concept.

FIG. 23 is an enlarged sectional view illustrating portions (e.g., corresponding to portions AA and BB of FIG. 3A) of a semiconductor memory device according to an example embodiment of the inventive concept. For concise description, previously described elements may be identified by the same reference numbers without repeating overlapping descriptions thereof.

Referring to FIG. 23, the lower semiconductor pattern 312 may be formed of or include at least one of silicon, germanium, or silicon-germanium. The lower semiconductor pattern 312 may include a first lower impurity region 316, a second lower impurity region 318, and a lower channel region 317. A lower portion of the lower channel region 317 may be connected to the first lower impurity region 316, and an upper portion of the lower channel region 317 may be connected to the second lower impurity region 318.

The first lower impurity region 316 may be in contact with the top surface of the lower conductive line 210, and a top surface of the second lower impurity region 318 may be in contact with a bottom surface of the first electrode 354. The first lower impurity region 316 may be used as one of source and drain regions, and the second lower impurity region 318 may be used as the other of source and drain regions. The first and second lower impurity regions 316 and 318 may have higher impurity concentrations than that of the lower channel region 317. The first and second lower impurity regions 316 and 318 may be of a n- or p-conductivity type.

The upper semiconductor pattern 322 may be formed of or include at least one of silicon, germanium, or silicon-germanium. The upper semiconductor pattern 322 may include a first upper impurity region 326, a second upper impurity region 328, and an upper channel region 327. An upper portion of the upper channel region 327 may be connected to the first upper impurity region 326, and a lower portion of the upper channel region 327 may be connected to the second upper impurity region 328.

The first upper impurity region 326 may be in contact with the top surface of the second electrode 352, and a top surface of the second upper impurity region 328 may be in contact with a bottom surface of the first electrode 354. The first upper impurity region 326 may be used as one of source and drain regions, and the second upper impurity region 328 may be used as the other of source and drain regions. The first and second upper impurity regions 326 and 328 may have higher impurity concentrations than that of the upper channel region 327. The first and second upper impurity regions 326 and 328 may be of a n- or p-conductivity type.

Each of the first upper impurity region 326, the upper channel region 327, and the second upper impurity region 328 may be formed of or include the same material as a corresponding one of the first lower impurity region 316, the lower channel region 317 and the second lower impurity region 318.

Figure 24:
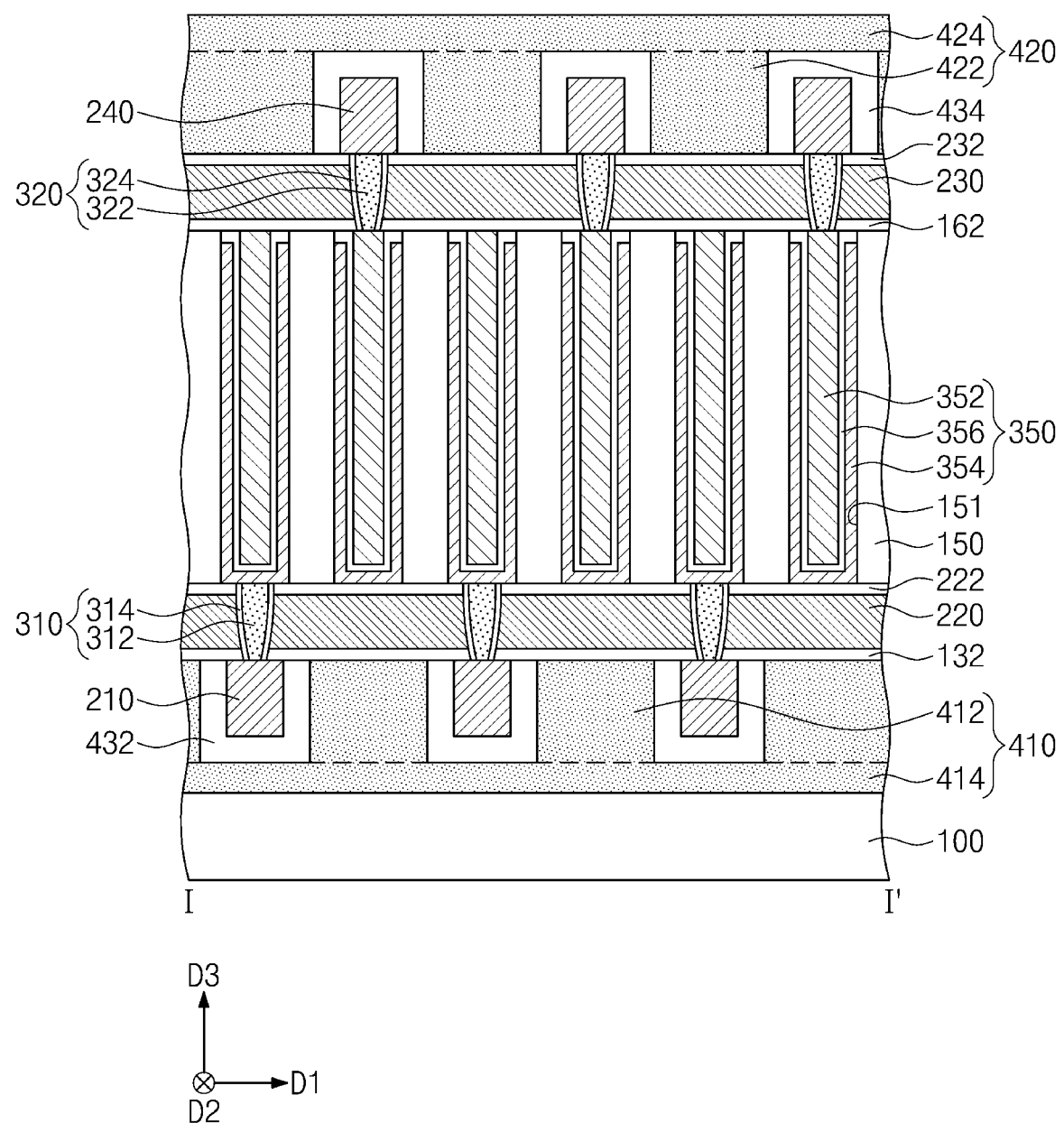
FIG. 24 is a sectional view, which is taken along a line I-I' of FIG. 2 to illustrate a semiconductor memory device, according to an example embodiment of the inventive concept.

FIG. 24 is a sectional view, which is taken along a line I-I' of FIG. 2 to illustrate a semiconductor memory device according to an example embodiment of the inventive concept. For concise description, previously described elements may be identified by the same reference numbers without repeating overlapping descriptions thereof.

Referring to FIG. 24, a lower oxide semiconductor pattern 410 may be provided between the third lower insulating layer 132 and the substrate 100, and an upper oxide semiconductor pattern 420 may be provided on the upper insulating patterns 232. The lower and upper oxide semiconductor patterns 410 and 420 may contain indium (In), gallium (Ga), zinc (Zn), and oxygen (O) elements. As an example, the lower and upper oxide semiconductor patterns 410 and 420 may be indium-gallium-zinc-oxide (IGZO) containing indium (In), gallium (Ga), zinc (Zn), and oxygen (O). Alternatively, the lower and upper oxide semiconductor patterns 410 and 420 may contain oxygen (O) and at least one of indium (In), gallium (Ga), zinc (Zn), tungsten (W), hafnium (Hf), or tin (Sn). The lower and upper oxide semiconductor patterns 410 and 420 may be formed of or include at least one of, for example, indium-tin-gallium-oxide (ITGO), indium-tungsten-oxide (IWO), indium-gallium-oxide (IGO), indium-zinc-oxide (IZO), indium-tin-oxide (ITO), gallium-zinc-oxide (GZO), gallium-silicon-zinc-oxide (IGSiZO), indium-hafnium-zinc-oxide (IHZO), or indium-hafnium-gallium-oxide (IHGO). The lower and upper oxide semiconductor patterns 410 and 420 may have an amorphous structure or a crystal structure of CAAC or spinel bixbyite type. The lower and upper oxide semiconductor patterns 410 and 420 may be formed of or include, for example, amorphous IGZO.

The lower oxide semiconductor pattern 410 may include first portions 412 between the lower conductive lines 210 and a second portion 414 between the lower conductive lines 210 and the substrate 100. The first portions 412 may be connected to the second portion 414. The first portions 412 may be electrically connected to each other through the second portion 414. The upper oxide semiconductor pattern 420 may include third portions 422, which are provided between the upper conductive lines 240, and a fourth portion 424, which is provided on and connected to the third portions 422. The third portions 422 may be electrically connected to each other through the fourth portion 424.

According to an example embodiment of the inventive concept, by applying a bias to the lower and upper oxide semiconductor patterns 410 and 420, it may be possible to prevent an interference issue from occurring between adjacent ones of the lower conductive lines 210 and adjacent ones of the upper conductive lines 240.

Figure 25A:
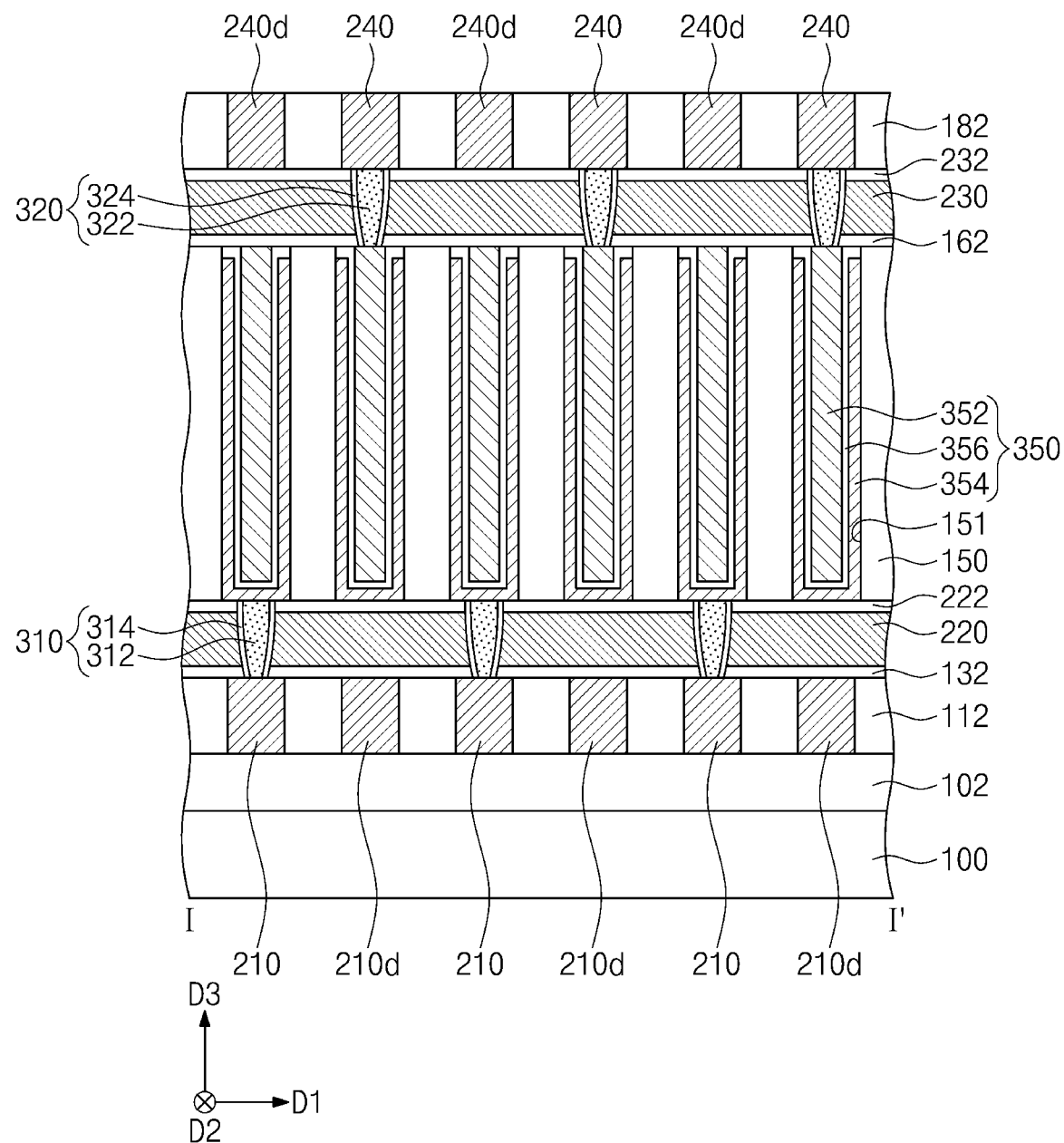
FIGS. 25A to 25C are sectional views, which are respectively taken along lines I-I', and of FIG. 2, to illustrate a semiconductor memory device, according to an example embodiment of the inventive concept.
Figure 25B:
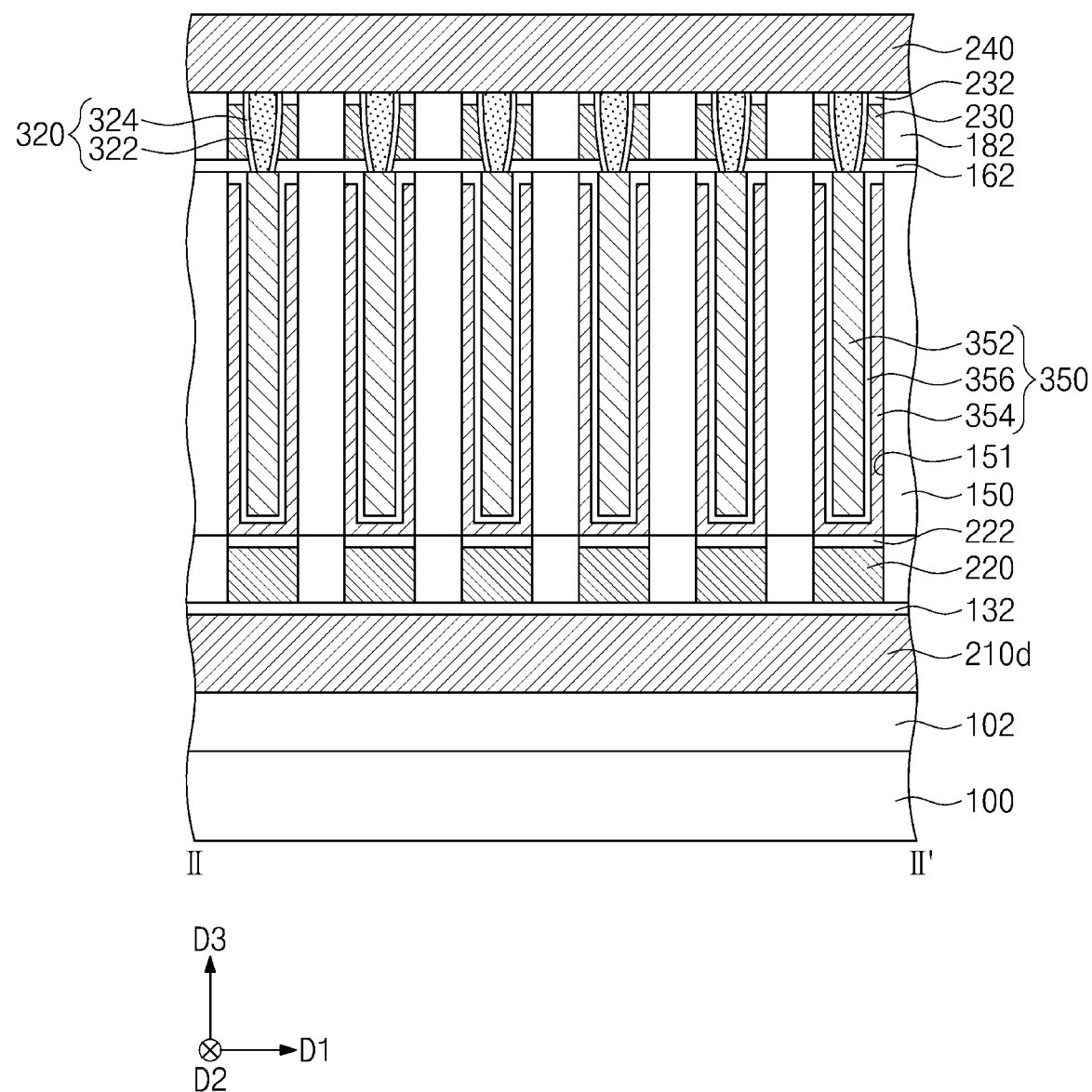
Figure 25C:
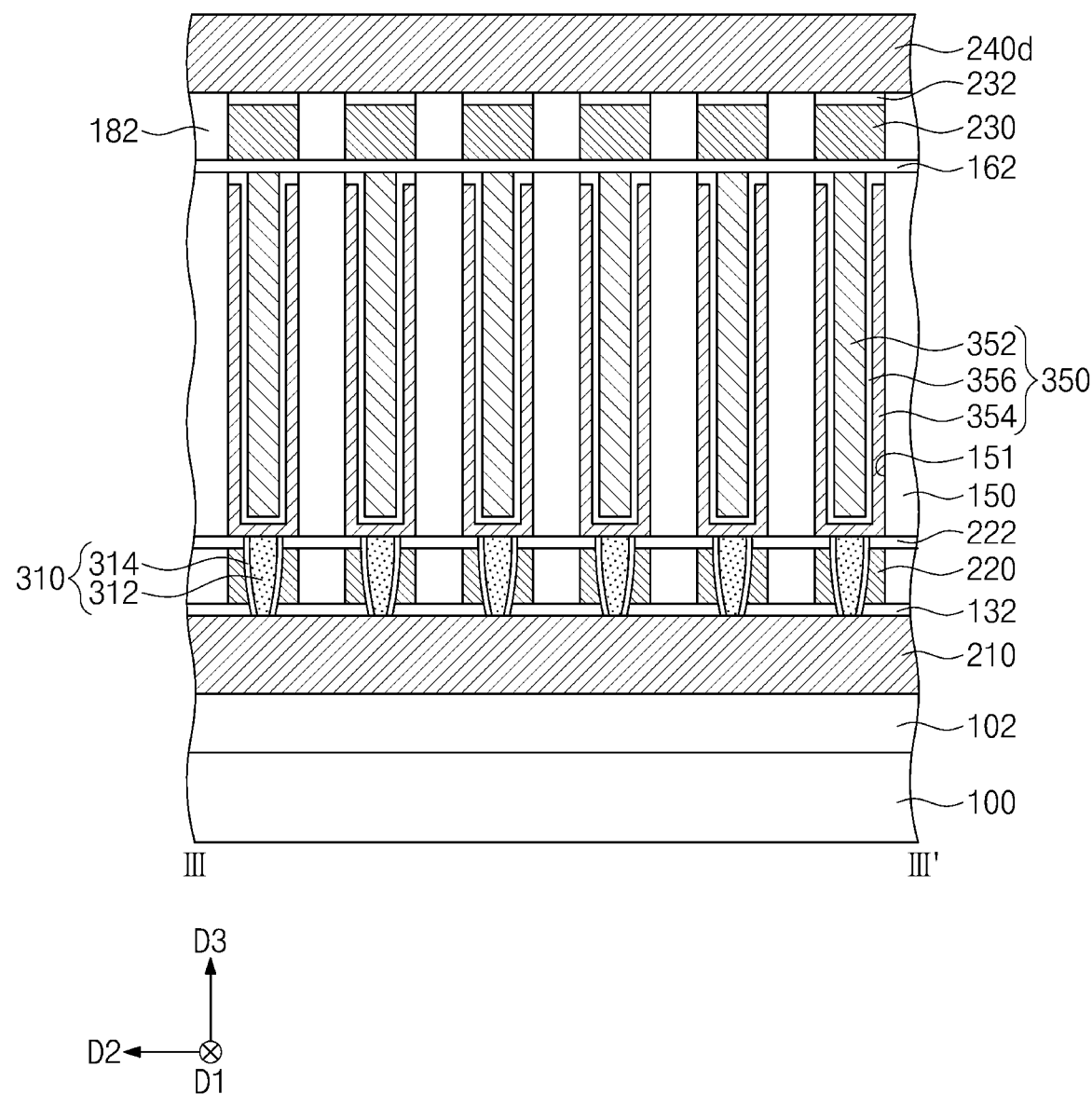

FIGS. 25A to 25C are sectional views, which are respectively taken along lines I-I', II-II', and III-III' and of FIG. 2 to illustrate a semiconductor memory device according to an example embodiment of the inventive concept. For concise description, a previously described element may be identified by the same reference number without repeating an overlapping description thereof.

Referring to FIGS. 25A to 25C, dummy lower conductive lines 210*d* may be disposed between the lower conductive lines 210, and dummy upper conductive lines 240*d* may be disposed between the upper conductive lines 240.

The dummy lower conductive lines 210*d* may be formed concurrently with the lower conductive lines 210 and may include the same material as the lower conductive lines 210. The dummy upper conductive lines 240*d* may be formed concurrently with the upper conductive lines 240 and may include the same material as the upper conductive lines 240. The dummy lower conductive lines 210*d* and the dummy upper conductive lines 240*d* may be electrically floated. For example, the dummy lower conductive lines 210*d* and the dummy upper conductive lines 240*d* may not be connected to any ground line in the semiconductor memory device. According to an example embodiment of the inventive concept, each of the dummy lower conductive lines 210*d* and the dummy upper conductive lines 240*d* may be completely enclosed by an insulating material.

Figure 26:
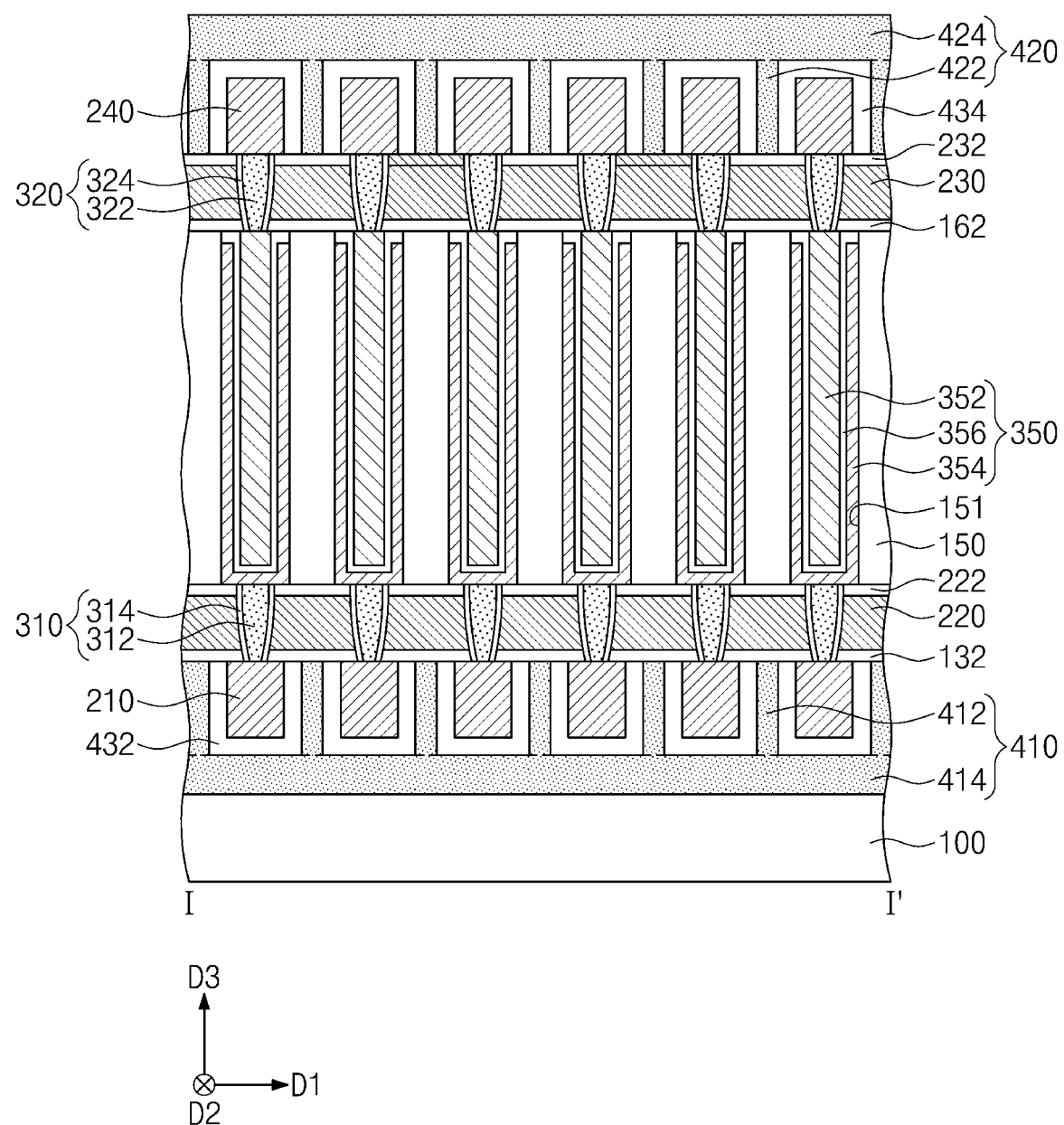
FIG. 26 is a sectional view, which is taken along the line I-I' of FIG. 2, to illustrate a semiconductor memory device, according to an example embodiment of the inventive concept.

FIG. 26 is a sectional view, which is taken along the line I-I' of FIG. 2 to illustrate a semiconductor memory device according to an example embodiment of the inventive concept. For concise description, previously described elements may be identified by the same reference numbers without repeating overlapping descriptions thereof.

Referring to FIG. 26, the capacitors 350 may be connected to the lower channel structure 310 and the upper channel structure 320. In detail, the first electrode 354 of the capacitor 350 may be connected to the lower conductive line 210 through the lower semiconductor pattern 312 of the lower channel structure 310. The second electrode 352 of the capacitor 350 may be connected to the upper conductive line 240 through the upper semiconductor pattern 322 of the upper channel structure 320. The lower channel structure 310 and the lower gate line 220 may constitute a lower transistor. The upper channel structure 320 and the upper gate line 230 may constitute an upper transistor. Each of the capacitors 350 may be connected to the lower transistor and the upper transistor. For example, a unit memory cell of the semiconductor memory device according to the present embodiments may include two transistors and one capacitor.

The lower oxide semiconductor pattern 410 may be disposed between the lower conductive lines 210, and the upper oxide semiconductor pattern 420 may be disposed between the upper conductive lines 240. The first portion 412 of the lower oxide semiconductor pattern 410 may have a width smaller than that of the lower conductive line 210, when measured in the first direction D1. The third portion 422 of the upper oxide semiconductor pattern 420 may have a width smaller than that of the upper conductive line 240, when measured in the first direction D1.

According to an example embodiment of the inventive concept, it may be possible to prevent an interference issue from occurring between conductive lines connected to a capacitor through a semiconductor pattern, and thus, a semiconductor memory device with improved electric characteristics and higher reliability may be provided.

While example embodiments of the inventive concept have been particularly shown and described, it will be understood by one of ordinary skill in the art that variations in form and detail may be made therein without departing from the spirit and scope of the attached claims.

What is claimed is:
1. A semiconductor memory device, comprising:
a lower gate line provided on a substrate and extended lengthwise in a first direction;
an upper gate line vertically overlapped with the lower gate line and extended lengthwise in the first direction;
a first capacitor provided between the lower gate line and the upper gate line;

a second capacitor provided between the lower gate line and the upper gate line and spaced apart from the first capacitor in the first direction;

a lower semiconductor pattern provided to penetrate the lower gate line and connected to the first capacitor;

an upper semiconductor pattern provided to penetrate the upper gate line and connected to the second capacitor; and a lower insulating pattern provided between the second capacitor and the lower gate line to cover an entire region of a bottom surface of the second capacitor.

2. The semiconductor memory device of claim 1, wherein the lower insulating pattern has a thickness smaller than a thickness of the lower gate line.

3. The semiconductor memory device of claim 1, wherein the lower insulating pattern has a same width as the lower gate line in a second direction that is perpendicular to the first direction.

4. The semiconductor memory device of claim 1, wherein the lower semiconductor pattern is provided to vertically penetrate the lower insulating pattern.

5. The semiconductor memory device of claim 1, further comprising:

a lower conductive line, which is provided between the substrate and the lower gate line and is extended lengthwise in a second direction perpendicular to the first direction, wherein a bottom surface of the lower semiconductor pattern is connected to a top surface of the lower conductive line, and a top surface of the lower semiconductor pattern is connected to a bottom surface of the first capacitor.

6. The semiconductor memory device of claim 1, wherein the lower semiconductor pattern comprises an oxide semiconductor.

7. The semiconductor memory device of claim 1, wherein the lower semiconductor pattern contains indium (In), gallium (Ga), zinc (Zn), and oxygen (O) elements.

8. The semiconductor memory device of claim 1, further comprising:

a lower conductive line, which is provided between the substrate and the lower gate line and is connected to the lower semiconductor pattern; and an upper conductive line, which is provided on the upper gate line and is connected to the upper semiconductor pattern, wherein the lower conductive line and the upper conductive line are extended lengthwise in a second direction perpendicular to the first direction.

9. The semiconductor memory device of claim 8, wherein the lower conductive line and the upper conductive line are spaced apart from each other in the first direction.

10. The semiconductor memory device of claim 1, further comprising an upper insulating layer, which is provided between the first capacitor and the upper gate line to cover an entire region of a top surface of the first capacitor.

11. The semiconductor memory device of claim 10, wherein the upper insulating layer has a thickness smaller than a thickness of the upper gate line.

12. A semiconductor memory device, comprising:

a lower gate line provided on a substrate and extended lengthwise in a first direction;

lower conductive lines provided between the substrate and the lower gate line and extended lengthwise in a second direction perpendicular to the first direction;

an upper gate line vertically overlapped with the lower gate line and extended lengthwise in the first direction;

upper conductive lines provided on the upper gate line and extended lengthwise in the second direction;

a first capacitor provided between the lower gate line and the upper gate line;

a second capacitor provided between the lower gate line and the upper gate line and spaced apart from the first capacitor in the first direction;

lower insulating patterns provided between the first capacitor and the lower gate line and between the second capacitor and the lower gate line;

an upper insulating layer provided between the first capacitor and the upper gate line and between the second capacitor and the upper gate line;

a lower semiconductor pattern provided to penetrate the lower gate line and the lower insulating pattern and to connect the first capacitor to one of the lower conductive lines; and an upper semiconductor pattern provided to penetrate the upper gate line and the upper insulating layer and to connect the second capacitor to one of the upper conductive lines, wherein a distance between two adjacent ones of the lower conductive lines is larger than a distance between the first capacitor and the second capacitor.

13. The semiconductor memory device of claim 12, wherein the first capacitor is disposed between two adjacent ones of the upper conductive lines, and wherein the second capacitor is disposed between two adjacent ones of the lower conductive lines.

14. The semiconductor memory device of claim 12, wherein the lower conductive lines are not vertically overlapped with the upper conductive lines.

15. The semiconductor memory device of claim 12, wherein a distance between two adjacent ones of the upper conductive lines is larger than the distance between the first capacitor and the second capacitor.

16. A semiconductor memory device, comprising:

a lower gate line provided on a substrate and extended lengthwise in a first direction;

an upper gate line vertically overlapped with the lower gate line and extended lengthwise in the first direction;

a capacitor between the lower gate line and the upper gate line, the capacitor comprising a first electrode and a second electrode on the first electrode;

an upper conductive line provided on the upper gate line and extended lengthwise in a second direction perpendicular to the first direction;

an upper semiconductor pattern provided to penetrate the upper gate line and to connect the upper conductive line to the second electrode; and a lower insulating pattern provided between a top surface of the lower gate line and a bottom surface of the first electrode, wherein the upper semiconductor pattern comprises an oxide semiconductor.

17. The semiconductor memory device of claim 16, wherein the lower insulating pattern covers an entire region of the bottom surface of the first electrode.

18. The semiconductor memory device of claim 16, wherein the lower insulating pattern has a same width as the lower gate line in the second direction.

19. The semiconductor memory device of claim 16, wherein the oxide semiconductor comprises amorphous indium-gallium-zinc-oxide (IGZO).

20. The semiconductor memory device of claim 16, further comprising:

an upper gate insulating pattern between the upper semiconductor pattern and the upper gate line,
wherein a distance between top and bottom surfaces of the upper gate insulating pattern is larger than a thickness of the upper gate line.

\* \* \* \* \*